(12) United States Patent
Matsumiya

(10) Patent No.: US 7,538,345 B2
(45) Date of Patent: May 26, 2009

(54) INSPECTION METHOD OF CONTACT FAILURE OF SEMICONDUCTOR DEVICE AND SEMICONDUCTOR DEVICE TO WHICH INSPECTION METHOD IS APPLIED

(75) Inventor: Yasuo Matsumiya, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 490 days.

(21) Appl. No.: 11/368,758

(22) Filed: Mar. 7, 2006

(65) Prior Publication Data

US 2007/0069757 A1    Mar. 29, 2007

(30) Foreign Application Priority Data

Sep. 27, 2005   (JP)   ............................. 2005-280481

(51) Int. Cl.
*H01L 23/58* (2006.01)
(52) U.S. Cl. .................................. 257/48; 257/E23.179
(58) Field of Classification Search .................. 257/48, 257/758, E23.179; 438/11, 14
See application file for complete search history.

(56) References Cited

U.S. PATENT DOCUMENTS 7,332,380 B2 *   2/2008   Matsuda ..................... 438/140

FOREIGN PATENT DOCUMENTS

| JP | 2000-36526 A | 2/2000 |
|---|---|---|
| JP | 2001-15511 A | 1/2001 |
| JP | 2004-501505 | 1/2004 |
| JP | 2004-228510 A | 8/2004 |
| WO | 01/80304 | 10/2001 |

OTHER PUBLICATIONS

Japanese Office Action dated Oct. 7, 2008, issued in corresponding Japanese Patent Applicaiton No. 2005-280481.

* cited by examiner

*Primary Examiner*—Hoai V Pham
(74) *Attorney, Agent, or Firm*—Westerman, Hattori, Daniels & Adrian, LLP.

(57) ABSTRACT

A substrate inspection method includes forming, along a route extending from a peripheral portion to a central portion of an inspection area, a conducting path built up by combining a plurality of first conducting elements disposed in a first layer of a substrate, a plurality of second conducting elements disposed in a second layer of the substrate and contact holes connecting the first conducting elements and the second conducting elements between the first layer and the second layer, and detecting electrons emitted from the inspection area by irradiating the inspection area with electron beams.

9 Claims, 26 Drawing Sheets

501

701

801

901

INSPECTION METHOD OF CONTACT FAILURE OF SEMICONDUCTOR DEVICE AND SEMICONDUCTOR DEVICE TO WHICH INSPECTION METHOD IS APPLIED

BACKGROUND OF THE INVENTION

The present invention relates to an inspection method of a contact failure of a semiconductor device and to the semiconductor device to which this inspection method is applied.

Inspection of a semiconductor integrated circuit, the whole circuit being exposed on the surface of a substrate in the middle of a wiring work in the case of wiring within the same layer, can therefore involve using a variety of optical defect inspection methods. In the case of a failure of a contact hole for connecting multi-layered wirings, however, a defective portion might be invisible from the surface. Hence, an exact grasp of a failure occurrence rate of the contact portion requires utilizing an electrical characteristic of a contact chain portion thereof. Herein, the contact chain represents a pattern with which the wirings are connected in a chained configuration between two or more wiring layers. Electric inspection methods of this contact chain are generally a method (which will hereinafter be referred to as a contact inspection) of connecting an electrode directly to the wiring and a method that utilizes a voltage contrast test.

Implementation of the contact inspection in the middle of a manufacturing process involves some difficulty. Therefore, the contact inspections are generally conducted batchwise at a stage of completing a wafer process. In this case, however, there is a large time difference in feedback from an inspection result to a manufacturing line. Hence, the contact inspection is no more than providing stuff for judging a level of how a product is graded. On the other hand, the voltage contrast test can be conducted in a non-contact state with the surface of the product in the middle of the manufacturing process and has been therefore in the progress of its being utilized over the recent years. It is to be noted that the following Patent document 1 discloses the voltage contrast test.

[Patent document 1] Japanese Unexamined Patent Publication No. 2004-501505

SUMMARY OF THE INVENTION

The related arts had no contrivance for performing an efficient inspection by reducing futility of the inspection patterns. It is an object of the present invention to detect the failure of the contact chain by effectively utilizing the inspection pattern in the case of performing the voltage contrast test.

The present invention adopts the following means in order to solve the problems. Namely, a inspection method according to the present invention comprises a step of forming, along a route extending from a peripheral portion to a central portion of an inspection area, a conducting path built up by combining a plurality of first conducting elements disposed in a first layer of a substrate, a plurality of second conducting elements disposed in a second layer of the substrate and contact holes connecting the first conducting elements and the second conducting elements between the first layer and the second layer, and a step of detecting electrons emitted from the inspection area by irradiating the inspection area with electron beams.

According to the present invention, the failure of the contact chain can be detected by effectively utilizing the inspection pattern in the case of performing the voltage contrast test.

DETAILED DESCRIPTION OF THE INVENTION

Figure 1:
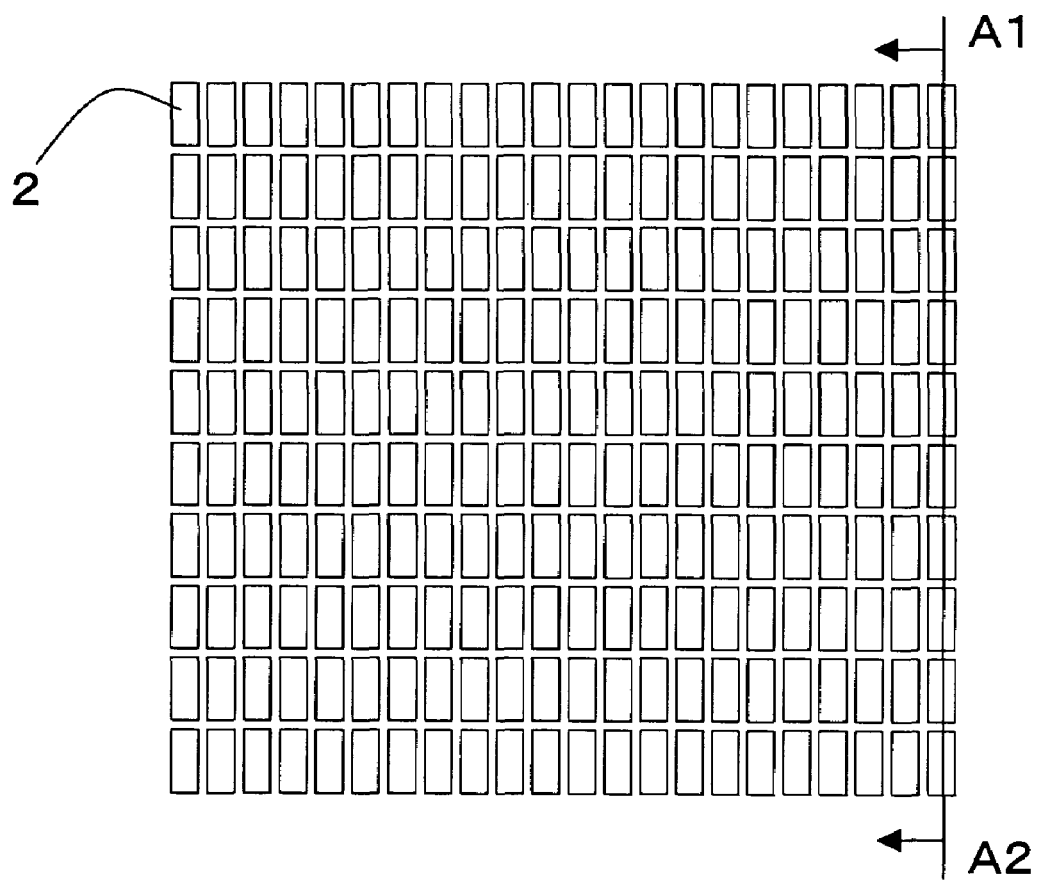
FIG. 1 is a plan view showing a configuration of the inspection pattern by a conventional voltage contrast test.

A detection method according a best mode (which will hereinafter be referred to as an embodiment) for carrying out the present invention, will hereinafter be described with reference to the drawings. Configurations in the following embodiments are an exemplification, and the present invention is not limited to the configurations in the embodiments.

Substance of the Present Invention

In a multi-layered wiring structure, an upper layer wiring and a lower layer wiring, which are composed of metals such as aluminum (Al) and copper (Cu), are electrically connected, and hence an interlayer insulating layer (film) between the upper layer wiring and the lower layer wiring is provided with a contact hole filled with a metal. The contact hole filled with the metal is called a contact. Further, a multi-layered wiring structure including a plurality of upper layer wirings, a plurality of lower layer wirings and a plurality of contacts and establishing electric connections between the wirings by the contacts, configures a contact chain (which is also referred to as a via chain or a through-hole chain).

Principle of Voltage Contrast Test

There is a method of inspecting a failure from a difference between voltage contrasts by use of an SEM (Scanning Electron Microscope) device as one of methods of inspecting a disconnection failure (an open portion) of an inspection pattern, a short-circuiting failure of the inspection pattern and so on. In this method, a surface of the inspection pattern (an existing area of the inspection pattern corresponds to an inspection area according to the present invention) is irradiated with electron beams, and secondary electrons emitted for this irradiation are detected. In this case, an emission quantity of the secondary electrons changes depending on a conducting state of the wiring of the inspection pattern, and therefore an image contrast is detected. At first, one end portion of the contact chain disposed in the inspection pattern is grounded at the same potential as that of a semiconductor substrate. Then, a plus electric field is applied to the inspection pattern in order to accelerate the emission of the secondary electrons. Next, the surface of the inspection pattern is irradiated with the electron beams. In an area extending from the portion (which will hereinafter be termed a ground side) where one end portion of the contact chain is grounded to the open portion, a deficiency of the electrons due to the secondary electrons emitted for the irradiation of the electron beams is supplemented from the ground side. Therefore, no change occurs in the potential in the area extending from the ground side to the open portion. On the other hand, there is no supplement of the electrons due to the secondary electrons emitted for the irradiation of the electron beams in the area extending from the other end portion (which will hereinafter be referred to as a floating side) of the contact chain. Hence, a positive charge takes place in the area from the floating side to the open portion, and the emission of the secondary electrons is restrained. Under a condition that the plus electric field is applied to the inspection pattern, there is no change in the emission quantity of the secondary electrons in the area from the ground side to the open portion. Accordingly, in the area from the ground side to the open portion, a bright contrast is detected by the voltage contrast test. On the other hand, in the area from the floating side to the open portion, a dark contrast is detected by the voltage contrast test. Therefore, the open portion of the contact chain can be specified based on a difference between the contrasts.

FIG. 1 is a plan view showing a configuration of the inspection pattern by a conventional voltage contrast test. The inspection of the contact chain by the voltage contrast test generally needs preparing the inspection pattern as illustrated in FIG. 1. In FIG. 1, in the inspection pattern, a plurality of metal elements 2 (corresponding to second conducting elements according to the present invention) taking substantially a rectangular shape is arrayed at an equal interval. Further, in FIG. 1, only the metal elements 2 are visible from the plane.

Figure 2:
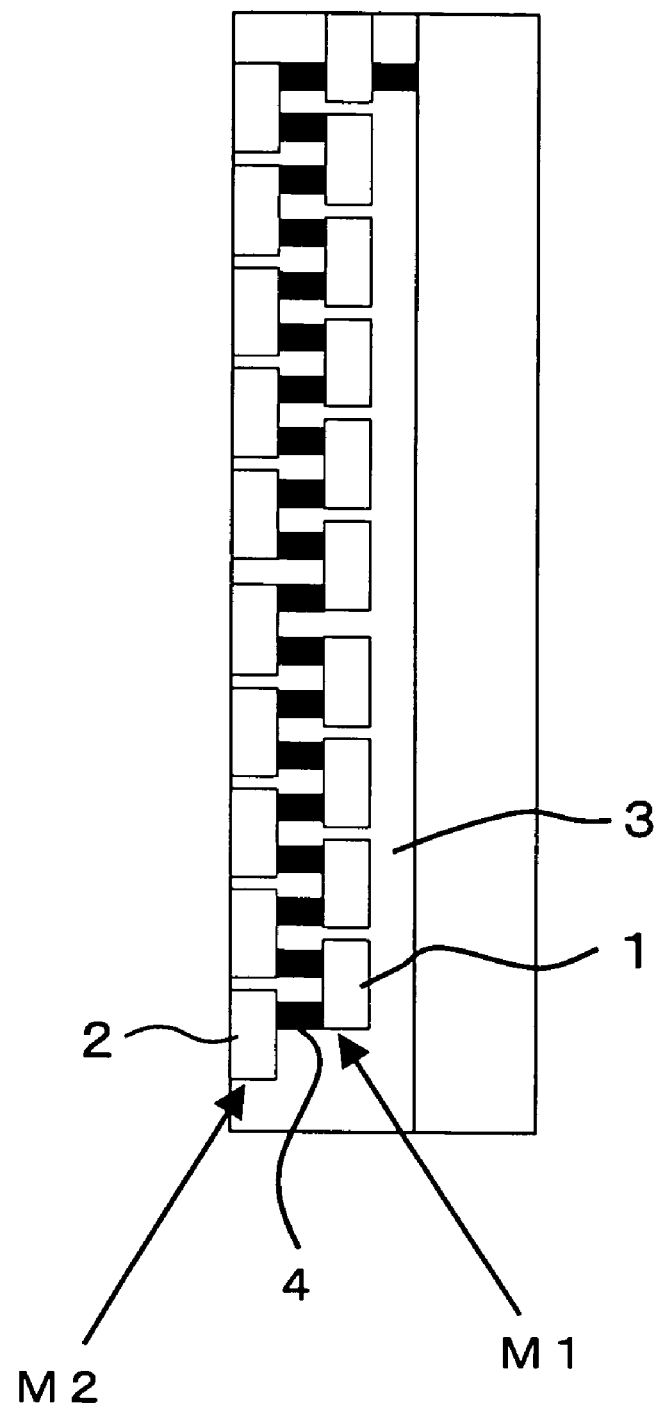
FIG. 2 is a sectional view taken along the line A1-A2 in FIG. 1.

FIG. 2 is a sectional view taken along the line A1-A2 in FIG. 1. FIG. 2 illustrates two metal wiring layers M1, M2. A multiplicity of metal elements 2 is arranged in the metal wiring layer M2 defined as a layer on the surface side of the substrate. A multiplicity of metal elements 1 (corresponding to first conducting elements according to the present invention) is arranged in the metal wiring layer M1 formed as a lower layer under the metal wiring layer M2. In FIG. 2, the metal elements 1 and the metal elements 2 are arranged alternately with respect to the plane of the substrate. Further, the metal element 1 and the metal element 2 adjacent to each other are electrically connected by a metal (unillustrated) embedded in a contact hole 4 provided in the interlayer insulating film 3 interposed therebetween.

Figure 3:
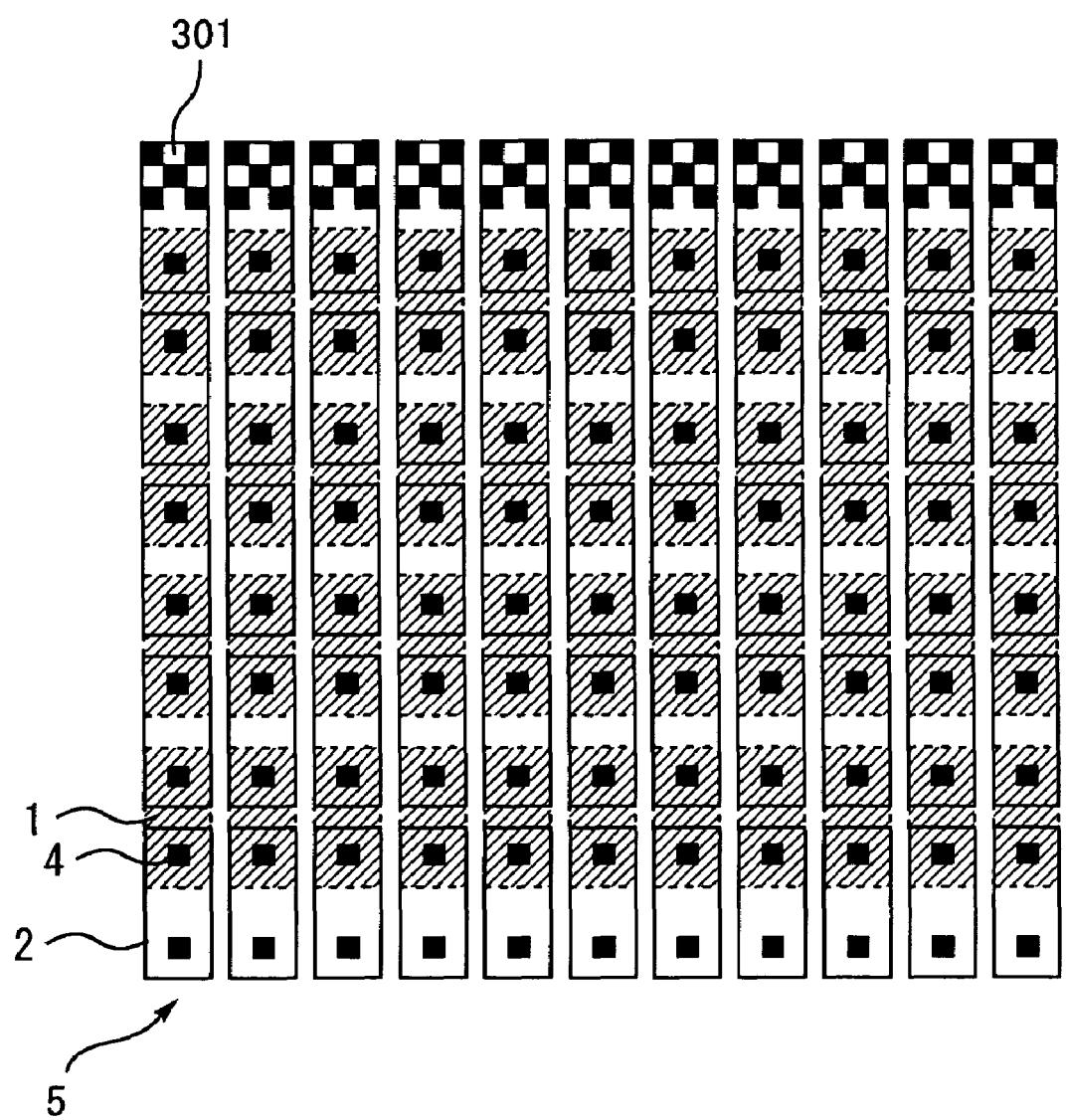
FIG. 3 is a view showing a layout of the contact chains in the conventional inspection pattern.

FIG. 3 is a view showing a layout of the contact chains in the conventional inspection pattern. In the conventional inspection pattern, a contact chain 5 is disposed as the inspection pattern. The contact chain 5 has the metal element 1 and the metal element 2. The metal element 1 and the metal element 2 are electrically connected by the metal (not shown) embedded in the contact hole 4 provided in the interlayer insulating film 3 (unillustrated). As shown in FIG. 3, the contact chains 5 are each arranged in a vertical direction (in an up-and-down direction in FIG. 3), and the contact chains adjacent to each other are not electrically connected. Further, an end portion 301 of each contact chain 5 is individually grounded. Namely, the contact chain 5 is connected so as to have the same potential as the semiconductor substrate has, and the end portion 301 is electrically connected to the semiconductor substrate.

Figure 4:
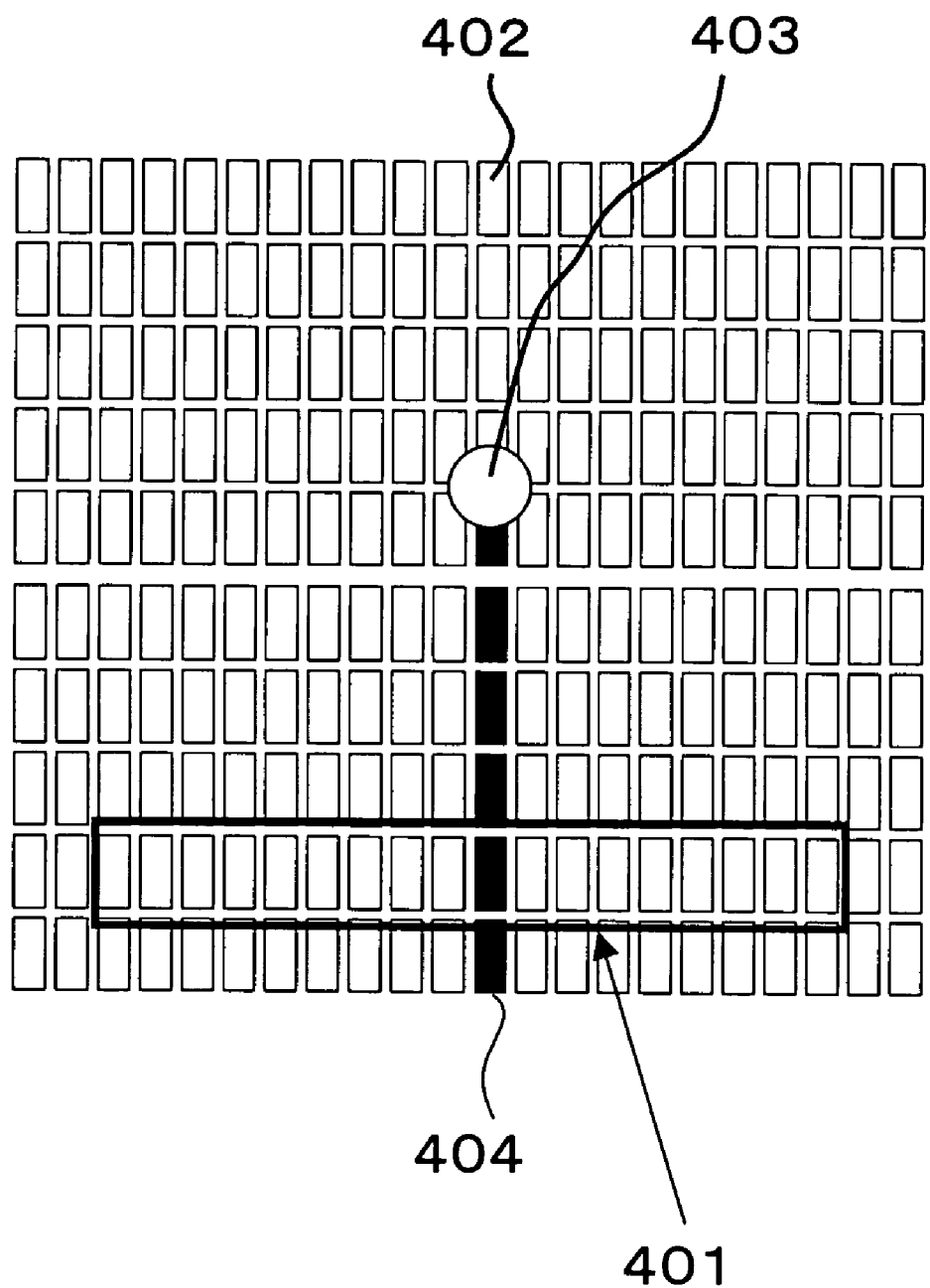
FIG. 4 is an explanatory view of the voltage contrast test in the conventional inspection pattern.

FIG. 4 is an explanatory view of the voltage contrast test in the conventional inspection pattern. In the case of performing the voltage contrast test about the conventional inspection pattern, as shown in FIG. 4, the test is conducted in a way that designates a designation area 401. Herein, the designation area connotes a range where the voltage contrast test takes place. Moreover, the inspection pattern is the same as FIG. 3 shows. Then, the designation area 401 within the inspection pattern is inspected. This method has such a merit that a comparatively broad area can be inspected in a comparatively short period of time. On the other hand, considering that a product is monitored by this method, it is desirable that the pattern for the inspection be small to the greatest possible degree. Such being the case, when reducing the inspection pattern in FIG. 4 and trying to set the reduced pattern into the product, the efficiency declines. Namely, as in the case of a general type of defect inspection device, a voltage contrast tester (testing device) has a fixed alignment error with respect to the inspection pattern on the substrate. Hence, even when a positional deviation occurs in the defect inspection device, the inspection pattern needs scanning. This being the case, an inspection pattern is further provided outside the existence area of the original inspection pattern. Thus, when setting the designation area in a way that takes the positional deviation into consideration, there increases an area of the inspection pattern that does not get involved with the inspection.

Next, a failure of the contact chain within the inspection pattern will be explained. There is a case in which the failure of the contact chain within the inspection pattern might occur due to a bias, whether small or large, of density of the contact holes in the inspection pattern. If the interval between the contact holes in the inspection pattern is narrow, the density of the contact holes in the inspection pattern increases. On the other hand, If the interval between the contact holes in the inspection pattern is wide, the density of the contact holes in the inspection pattern decreases. Herein, as a method of forming the contact hole into the inspection pattern in the interlayer insulating film, there is a method involving the use of a gas for vaporizing an oxide film. This method is that if the interlayer insulating film is composed of the oxide film, the contact hole is opened in the oxide film by vaporizing the oxide film with the gas for vaporizing the oxide film.

Considering, for instance, one example under a specified oxide film etching condition, if the density of the contact holes within the inspection pattern is large, a quantity of using the gas for vaporizing the oxide film rises. Accordingly, a concentration of the gas for vaporizing the oxide film gets thinned. Therefore, an etching rate at which the contact hole is opened in the oxide film decreases. When the etching rate decreases, the etching in the oxide film is restrained, and the opening of the contact hole becomes smaller than in the case of the contact hole being normally opened. Further, for example, if the density of the contact holes in the inspection pattern is small, the quantity of using the gas for vaporizing the oxide film decreases. Accordingly, the concentration of the gas for vaporizing the oxide film gets thickened. Hence, the etching rate at which the contact hole is opened in the oxide film increases. When the etching rate increases, the etching in the oxide film is accelerated, and the opening of the contact hole becomes larger than in the case of the contact hole being normally opened. Thus, it follows that the opening of the contact hole becomes small or large depending on the largeness or the smallness of the density of the contact holes. Accordingly, the largeness and the smallness of the density of the contact holes become a cause of the failure of the contact chain more highly than the density of the contact holes that are normally opened.

Such a possibility is high that this kind of failure of the contact chain, which is related to the largeness and the smallness of the density of the contact holes, might occur with a fixed probability. A failure of the contact chain, which is not related to the largeness and the smallness of the density of the contact holes, has a high possibility of getting detectable by conducting the voltage contrast test using the inspection pattern having the large area. While on the other hand, the failure of the contact chain, which is related to the largeness and the smallness of the density of the contact holes, has a high possibility of getting detectable even when reducing the inspection pattern.

In the case of effecting the voltage contrast test about the inspection pattern having the large area, any problem does not arise even if a portion not getting involved with the inspection is incorporated into the inspection pattern in consideration of the positional deviation. Namely, in the case of checking the inspection pattern having the large area, the area not getting involved with the inspection taking account of the positional deviation is small in its ratio to the effective designation area. Accordingly, a necessity of eliminating the area not getting involved with the inspection taking account of the positional deviation is low. On the other hand, for detecting the failure of the contact chain related to the largeness and the smallness of the density of the contact holes, the inspection pattern can be set in the small area. Therefore, if the designation area of the inspection pattern is small, the voltage contrast test can be conducted by employing an unable-to-install place for the inspection pattern having the large area. If the existence area of the inspection pattern is small, however, a problem arises in the place where the voltage contrast test is performed. Namely, when incorporating, into the inspection pattern, the portion not getting involved with the inspection taking account of the positional deviation, the area not getting involved with the inspection becomes large in its ratio with respect to the effective designation area.

As the designation area for the voltage contrast test, in FIG. 4, the designation area 401 is set on the inspection pattern. If the open portion (a disconnection, a contact failure, etc) occurs in the contact chain, the potential is kept normal in the area from an end portion 402 on the ground side of the contact chain to the open portion 403. Hence, an image contrast in this portion becomes bright. While on the other hand, a floating state appears in the area from the open portion 403 to the other end portion 404. Therefore, the potential rises in the area from the open portion 403 to the end portion 404, so that the image contrast gets darkened. Thus, if the open portion 403 occurs, the designation area 401 is inspected by the voltage contrast test. Then, if the contrast from the open portion 403 to the end portion 404 is detected as a dark contrast, it can be detected from the voltage contrast test that the contact chain has a failure.

Figure 5:
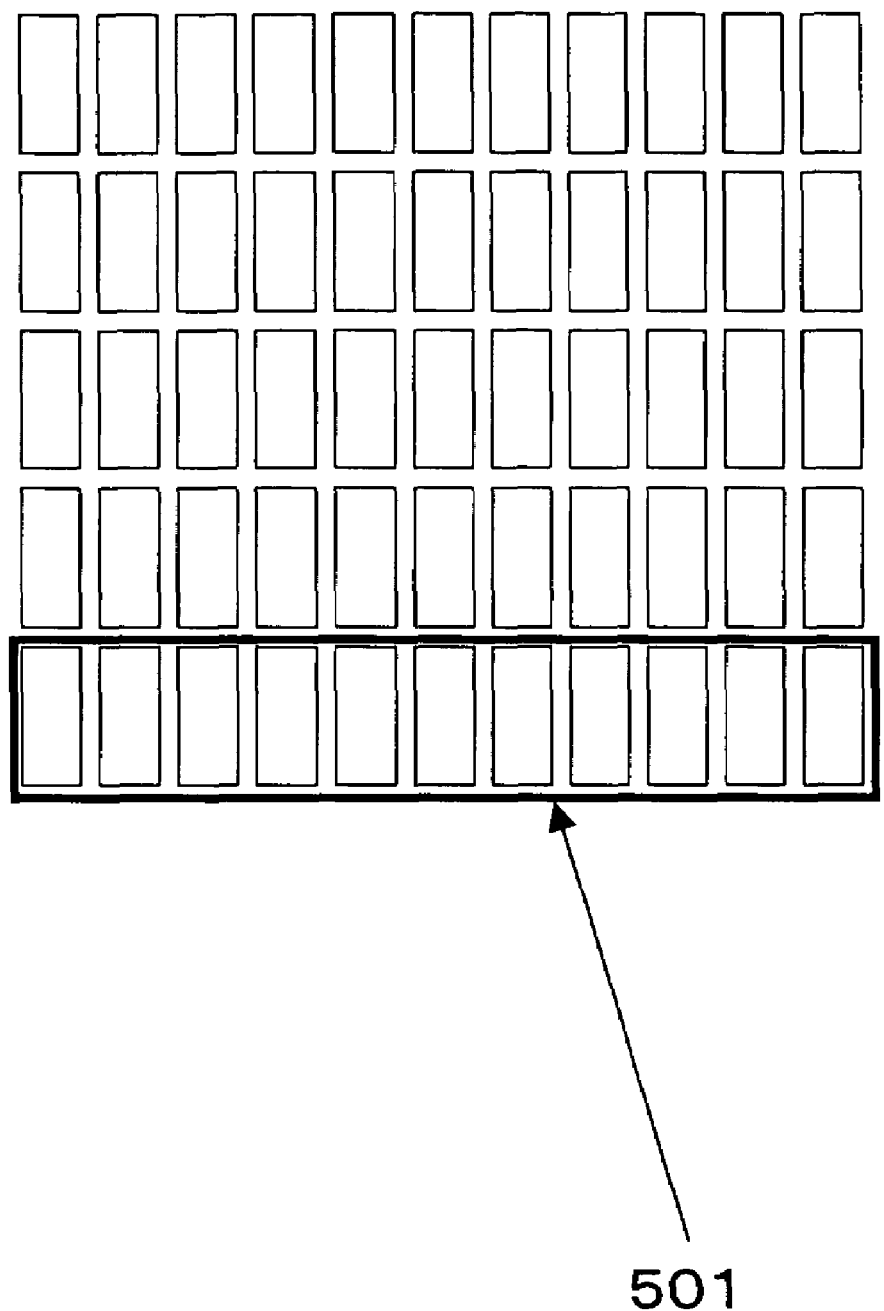
FIG. 5 is an explanatory view of how the designation area is set on the inspection pattern in the conventional voltage contrast test.

FIG. 5 is an explanatory view of how the designation area is set on the inspection pattern in the conventional voltage contrast test. In FIG. 5, for checking all the inspection patterns, a designation area 501 is set. Depending on alignment accuracy of the testing device (tester), however, the positional deviation occurs to some extent on the vertical and lateral sides in the area to be actually inspected. In this case, when executing the voltage contrast test, there is also some fear that the portion with the occurrence of the positional deviation in the designation area 501 is detected as a failure or an area excluding the inspection pattern is inspected.

Figure 6:
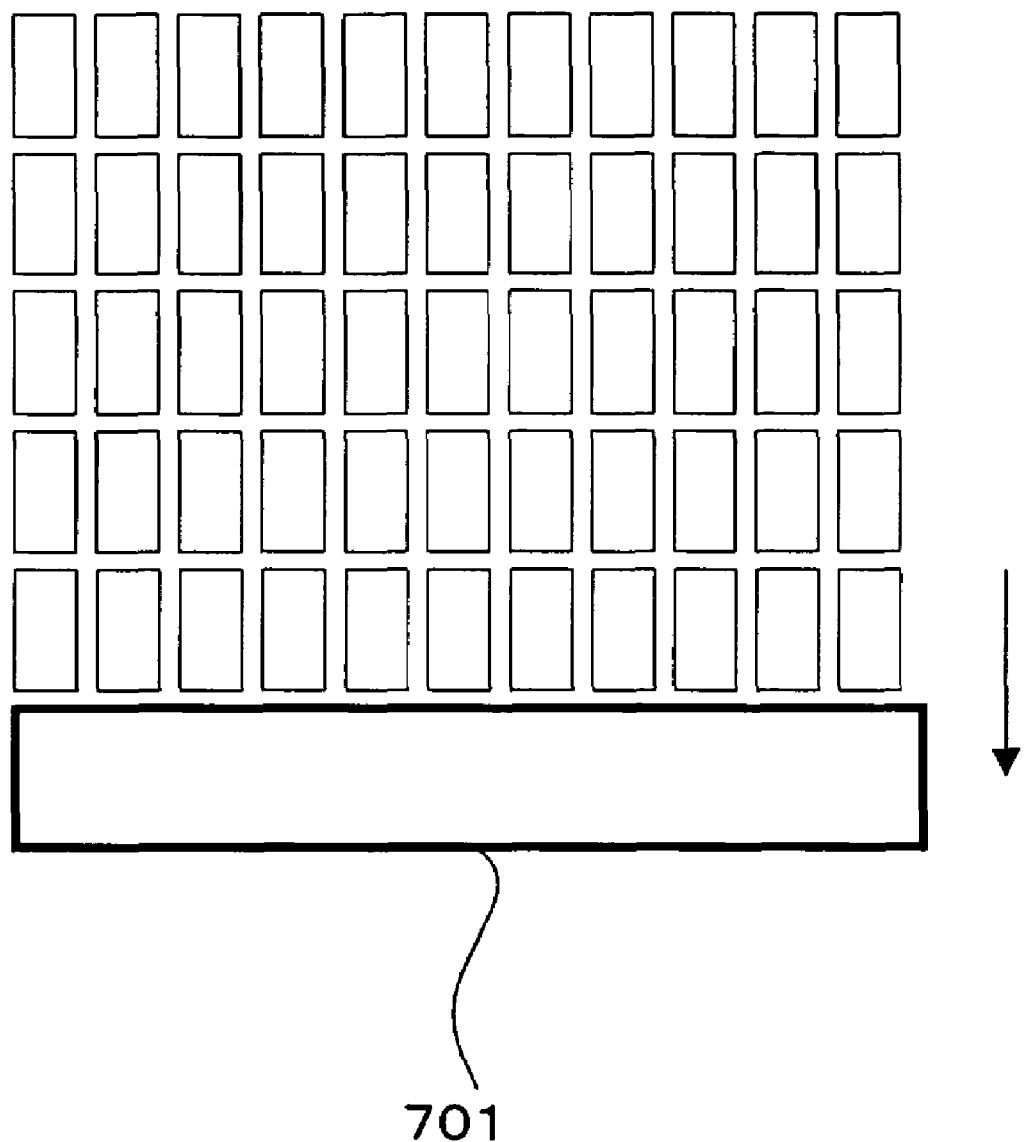
FIG. 6 is an explanatory view in a case where a designation area 501 in FIG. 5 deviates in its position in a right direction.

FIG. 6 is an explanatory view in such a case that an actually inspected designation area 601 deviates in position in an arrowhead direction (the right direction) from the set designation area 501 in FIG. 5. If the designation area 501 in FIG. 5 deviates in position in the arrowhead direction and when the executing the voltage contrast test, a position-deviated portion 602 of the actual designation area 601 is detected as a failure.

Figure 7:
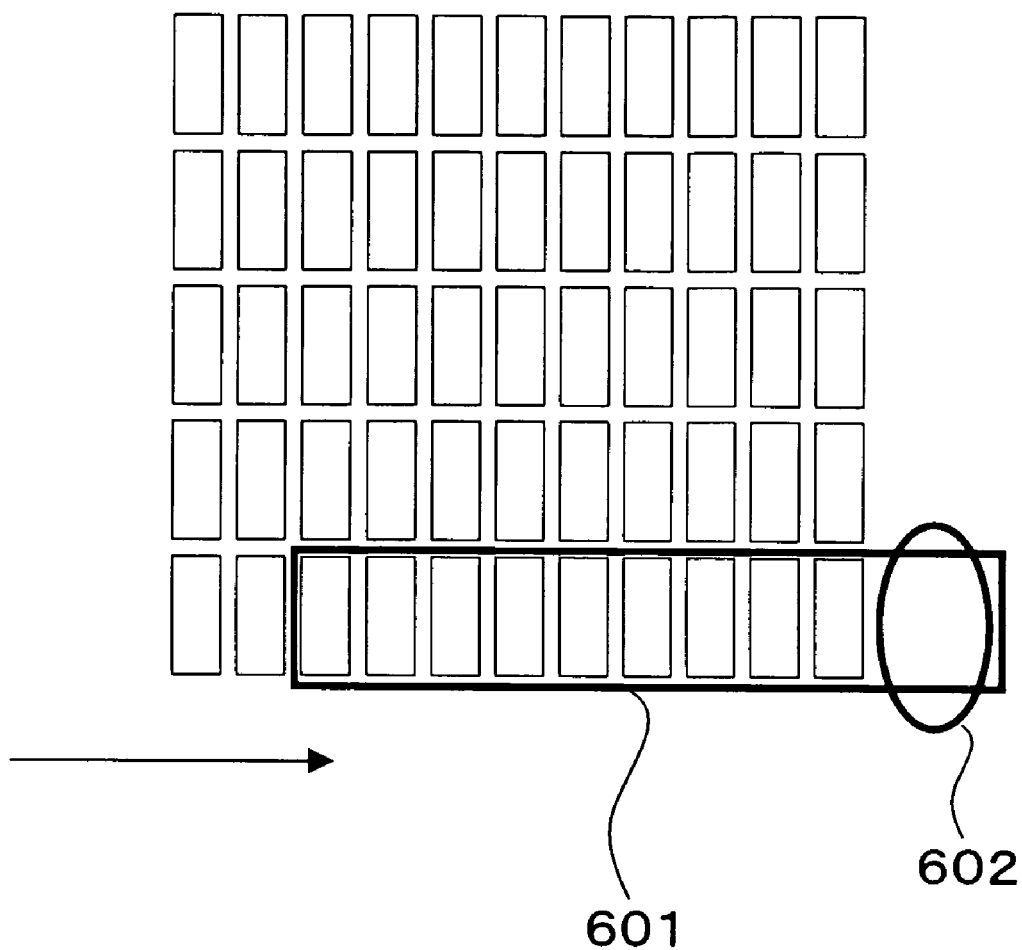
FIG. 7 is an explanatory view in a case where the designation area 501 in FIG. 5 deviates in its position in a downward direction.

FIG. 7 is an explanatory view in such a case that an actually inspected designation area 701 deviates in position in the downward direction from the set designation area 501 in FIG. 5. If the designation area 501 in FIG. 5 deviates in position in the downward direction, the voltage contrast test is performed over the designation area 701 in FIG. 7. Accordingly, it follows that the voltage contrast test is conducted in an area excluding the inspection pattern.

Figure 8:
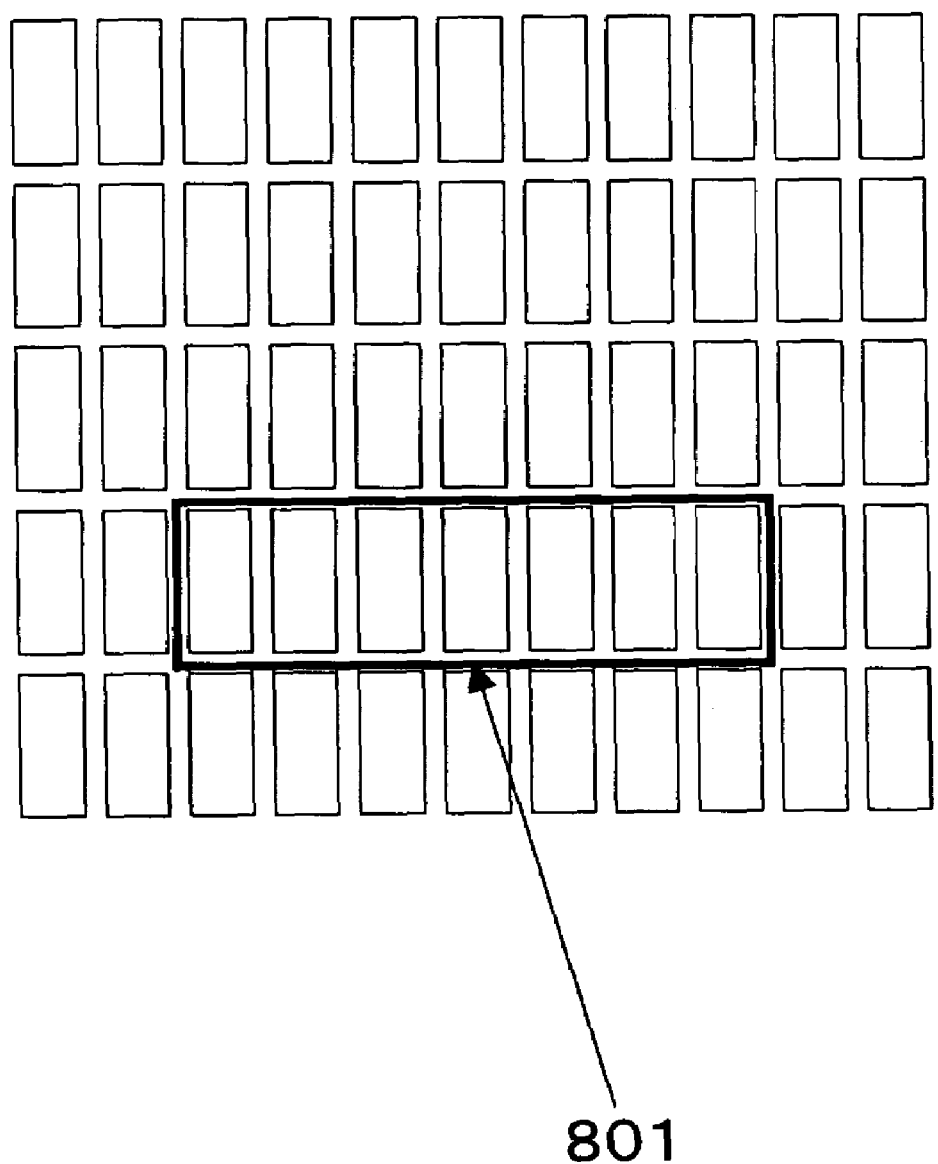
FIG. 8 is an explanatory view in a case where a designation area 801 is set inside the inspection pattern.

FIG. 8 is an explanatory view in the case of setting a designation area 801 inwardly of the inspection pattern. When the designation area 501 moves in the vertical and lateral directions due to the positional deviation, it is necessary for performing the voltage contrast test in the inspection pattern to set the designation area 801 inside the inspection pattern as illustrated in FIG. 8. Namely, as shown in FIG. 8, when the designation area 801 is set inwardly of the inspection pattern and even if the designation area 801 moves in the vertical and lateral directions due to the positional deviation, the voltage contrast test can be conducted within the inspection pattern. As shown in FIG. 8, however, in the case of setting the designation area 801 inside the inspection pattern, there occurs a portion that is not used for the inspection within the inspection pattern.

Figure 9:
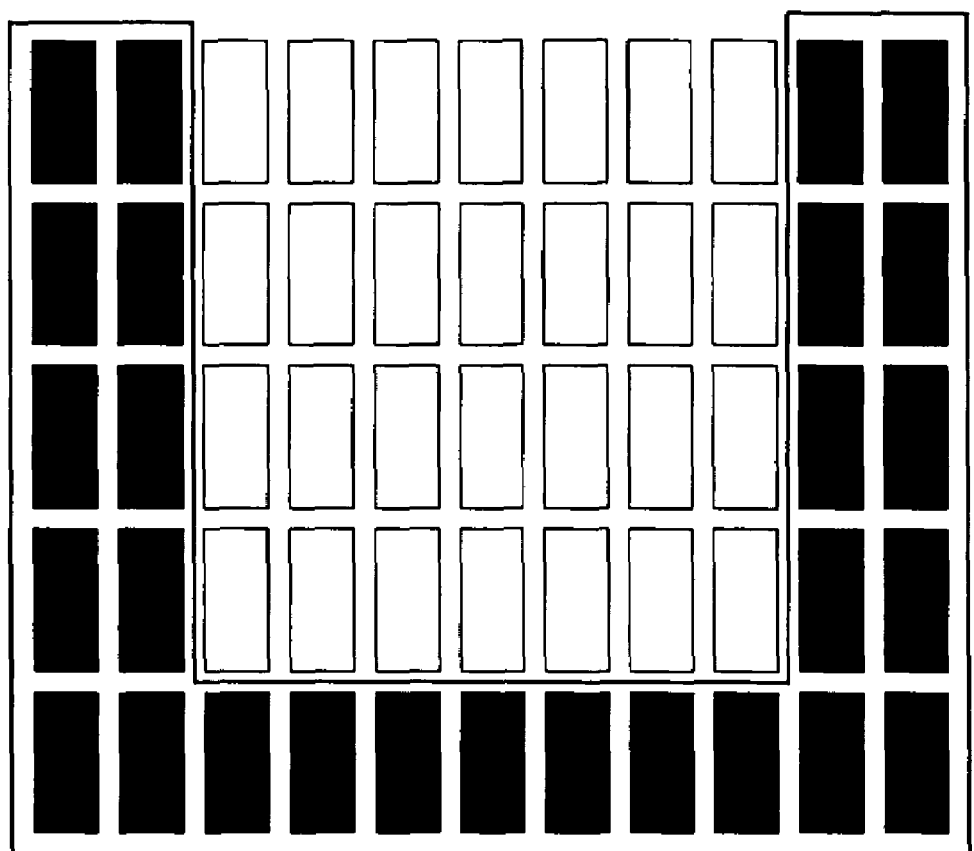
FIG. 9 is an explanatory view of a portion that is not used for the inspection within the inspection pattern.

FIG. 9 is an explanatory view of the portion that is not used for the inspection within the inspection pattern. As illustrated in FIG. 8, in the case of setting the designation area 801 inwardly of the inspection pattern, it follows that a non-designation area 901 in FIG. 9 is not used for the inspection. Namely, even if the failure occurs in the contact chain in the non-designation area 901, this failure does not affect a result of the voltage contrast test.

EMBODIMENT

Figure 10:
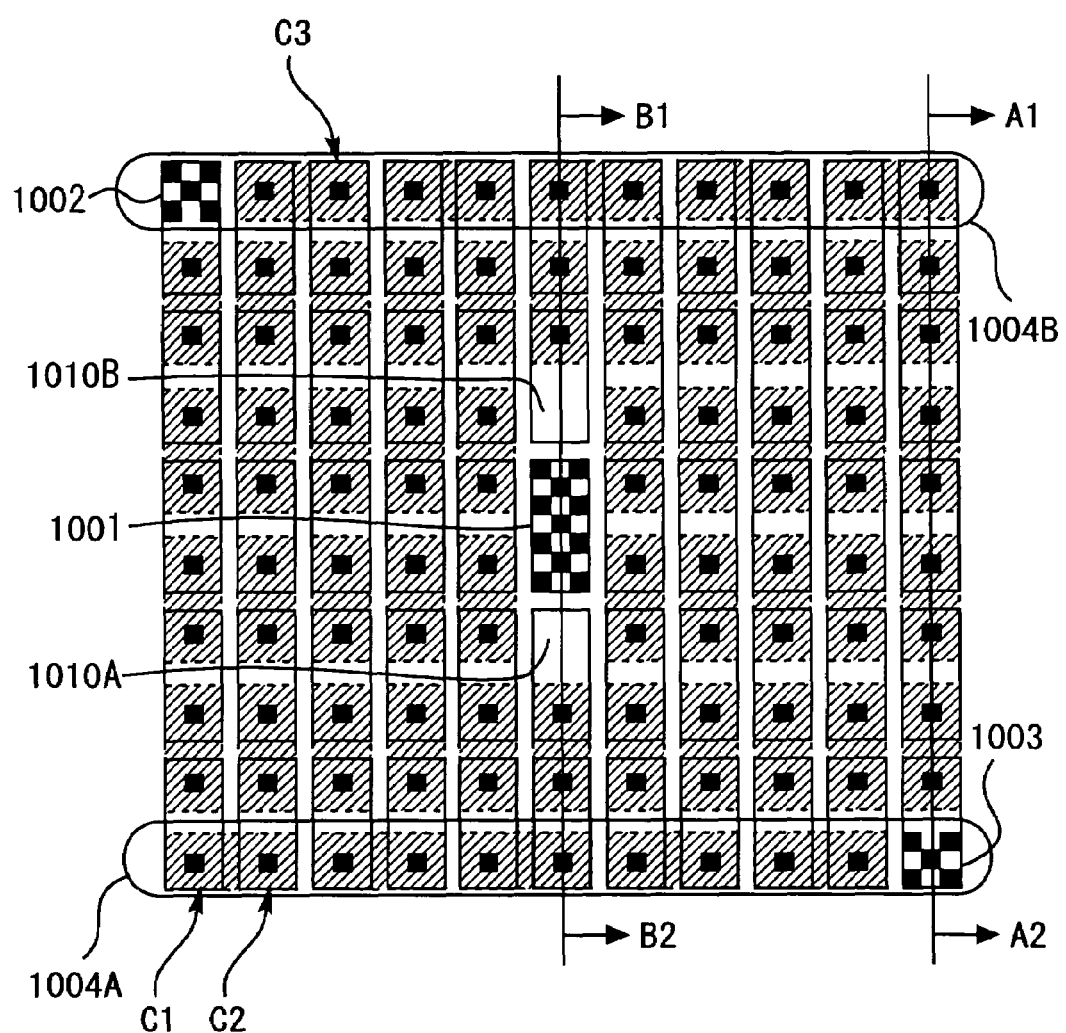
FIG. 10 is a plan view showing a configuration of an inspection pattern in an embodiment of the present invention.
Figure 11:
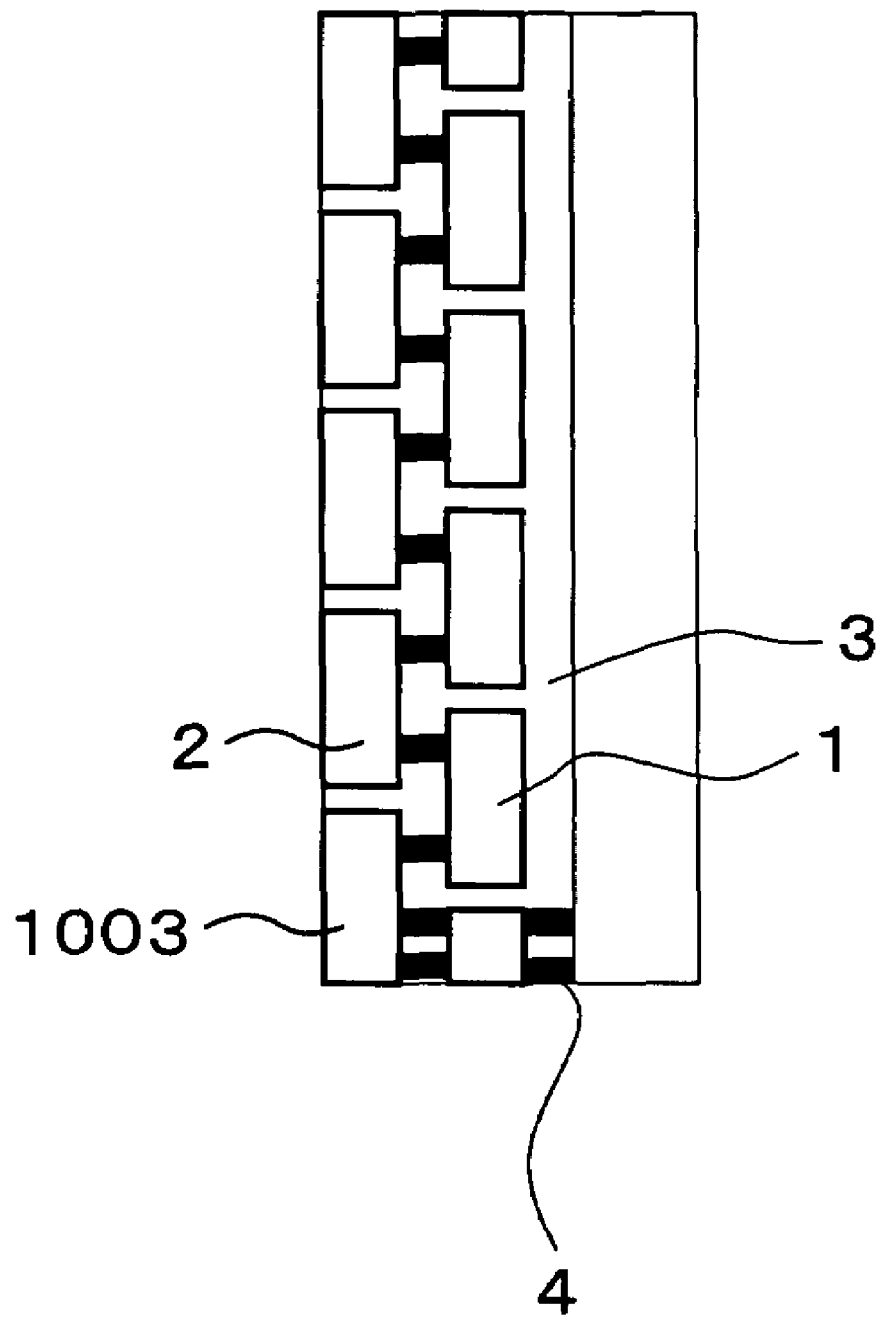
FIG. 11 is a sectional view taken along the line A1-A2 in FIG. 10.
Figure 12:
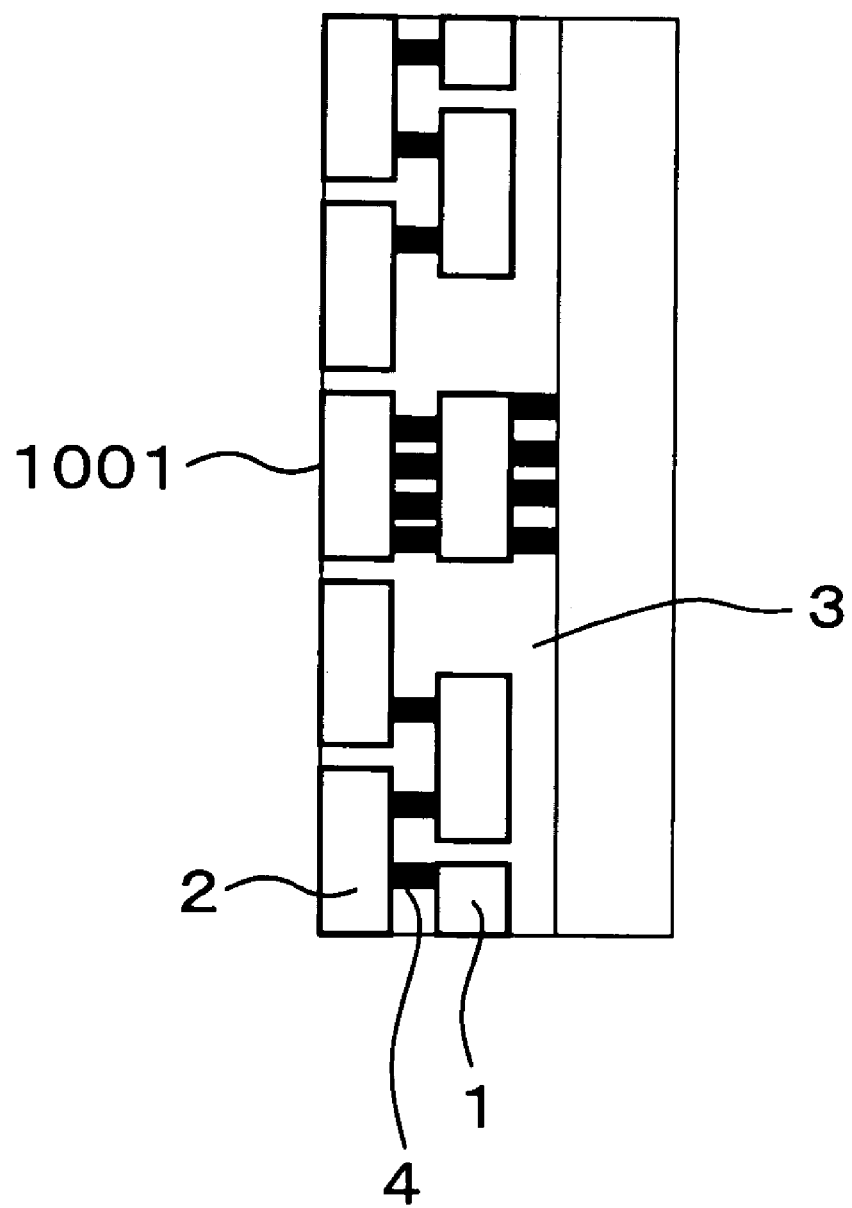
FIG. 12 is a sectional view taken along the line B1-B2 in FIG. 10.

Such being the case, herein, a configuration of the contact chain is contrived to minimize the area that is not used for the inspection. The embodiment of the present invention will hereinafter be described with reference to the drawings in FIGS. 10 through 26. FIG. 10 is a plan view showing a configuration of the inspection pattern in the embodiment of the present invention. FIG. 11 is a sectional view taken along the line A1-A2 in FIG. 10. FIG. 12 is a sectional view taken along the line B1-B2 in FIG. 10. FIG. 10 shows that a central portion 1001 defined as the metal element 2 at an central area of the inspection pattern is grounded, and the contact chains between the metal element 1 and the metal element 2, of which an end portion 1002 and an end portion 1003 are grounded, are disposed on the periphery of the inspection pattern. Further, the metal element 2 is grounded so that the end portions 1002 and the end portion 1003 of the contact chains are in a diagonal relationship.

As shown in FIG. 10, both of the metal elements 1 and 2 take substantially a rectangular shape on the plane. The metal element 1 and the metal element 2 are positioned so that their end portions in longitudinal directions thereof are superposed on each other in the plan view. Then, the end portions in the longitudinal directions are connected by the contacts, and chain-shaped conducting paths are formed in the longitudinal directions of the metal element 1 and the metal element 2. One line of contact chain is formed extending from one side (an outside portion 1004B) forming an outer periphery of the existence area of the inspection pattern taking substantially the rectangular shape toward an opposite side (an outside portion 1004A) thereof. The contact chain is disposed so as to be folded back in the central direction at one outside portion 1004A (the opposite side) of the inspection pattern. Namely, adjacent contact chains C1 and C2 are connected to each other at the outside portion 1004A. Then, the contact chain, which is disposed so as to be folded back in the central direction, is also disposed so as the contact chain is disposed so as to be further folded back in the central direction at the other outside portion 1004B of the inspection pattern. Namely, the adjacent contact chains C2 and C3 are connected to each other at the outside portion 1004B. Thus, the contact chain is repeatedly disposed in the way of its being folded back at the outside portions 1004A and 1004B of the inspection pattern. Moreover, the metal element 2 of the central portion 1001 of the inspection pattern is not electrically connected to the contact chain. Accordingly, it follows that end portions 1010A and 1010B of the contact chain neighboring to the central portion 1001 are grounded respectively at the end portions 1002 and 1003 of the contact chain.

In the contact chain, as illustrated in FIG. 11, the metal element 1 and the metal element 2 are alternately disposed. Then, the electric connection is established by the contact defined as the metal (unillustrated) embedded in the contact hole 4 provided in the interlayer insulating film 3 between the metal element 1 and the metal element 2. The end portion 1002 and the end portion 1003 of the contact chain in FIG. 10 are grounded, and each grounded portion has a plurality of contacts. FIGS. 11 and 12 show that each grounded portion has the plurality of contacts. As shown in FIG. 11, the end portion 1003 has a plurality of contacts. Further, the end portion 1002 similarly has a plurality of contacts. Then, as illustrated in FIG. 12, the central portion 1001 of the inspection pattern is grounded and has a plurality of contacts.

Figure 13:
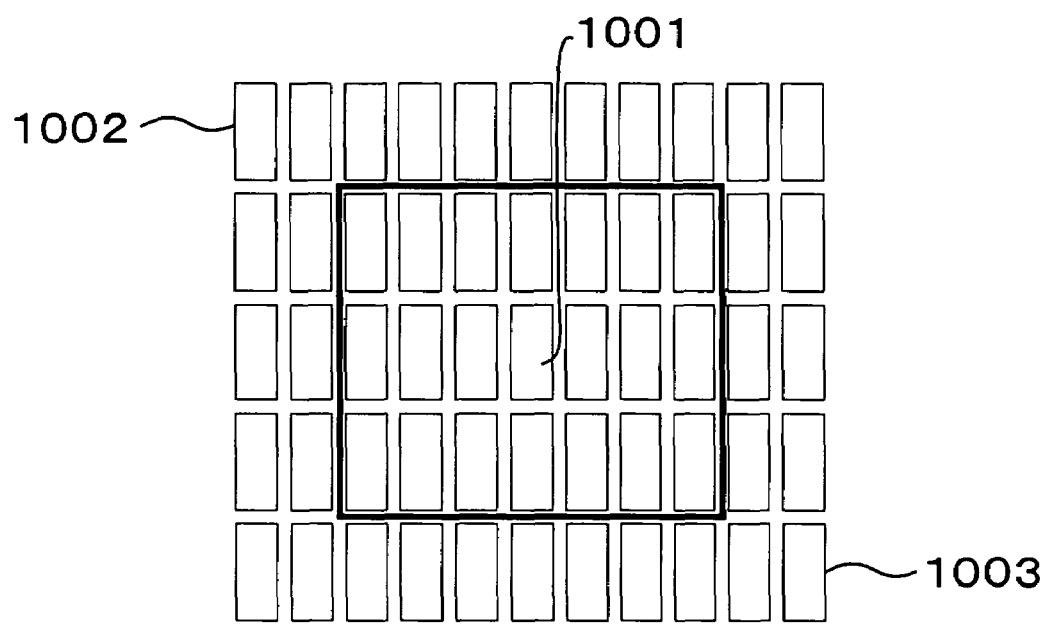
FIG. 13 is a plan view showing a position set as the designation area.

FIG. 13 is a plan view showing a position to be set for the designation area. The inspection pattern is the same as FIG. 10 shows. In the voltage contrast test, taking the positional deviation of the voltage contrast tester into consideration, a range including the central portion of the inspection pattern shall be the designation area (corresponding to a partial area according to the present invention). According to the embodiment, even when the designation area moves in the vertical and lateral directions, if the range including the central portion of the inspection pattern is set as the designation area, the voltage contrast test can be conducted. If none of the open portion exists in the inspection pattern, the metal elements 2 excluding the metal element 2 of the central portion 1001 are grounded at the end portion 1002 and the end portion 1003 via the contact chain. Hence, there is no difference between potentials of the metal elements 2, a difference between the contrasts does not occur, and it is detected by the voltage contrast test such that there is no open portion.

Figure 14:
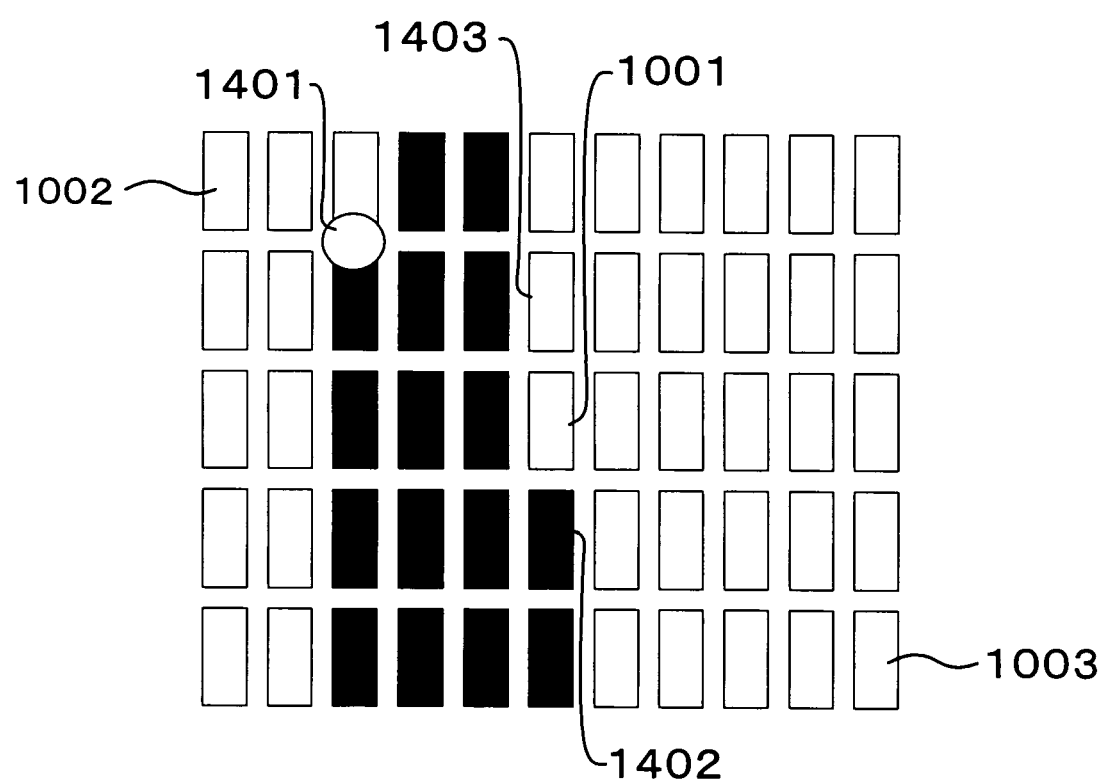
FIG. 14 is a plan view showing a difference between voltage contrasts in a case where there is one open portion.

FIG. 14 is a plan view showing a difference between the voltage contrasts in a case where there is one open portion. The inspection pattern is the same as FIG. 10 illustrates. To be specific, the metal element 2 of the central portion 1001 of the inspection pattern is so grounded as to be separated from the end portions (just-anterior portions 1402, 1403) of the contact chain. On the other hand, the contact chains with the end portion 1002 and the end portion 1003 being grounded are disposed on the periphery of the inspection pattern. If there is one open portion in such an inspection pattern, the bright contrast is exhibited on the ground side from the position where the open portion occurs, and the dark contrast is exhibited on the floating side from the position where the open portion occurs. FIG. 14 shows that the bright contrast is exhibited in the area from the open portion 1401 to the end portion 1002. Then, the dark contrast is exhibited in the area from the open portion 1401 to the just-anterior portion 1402 to the central portion 1001.

Figure 15:
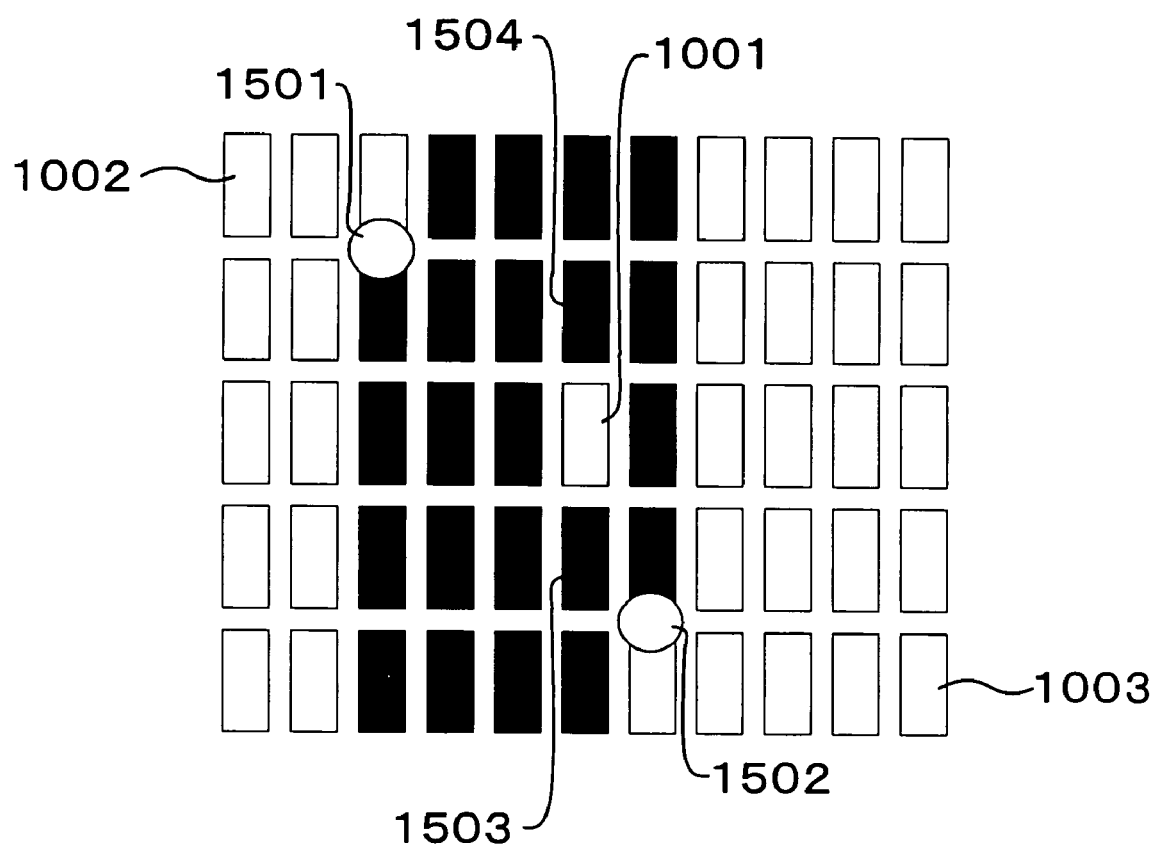
FIG. 15 is a plan view showing a difference between the voltage contrasts in a case where there are two open portions.

FIG. 15 is a plan view showing a difference between the voltage contrasts in a case where there are two open portions. The inspection pattern is the same as FIG. 10 illustrates. In the case that there are two open portions, the bright contrast is exhibited on the ground side from the position where each open portion occurs, and the dark contrast is exhibited on the floating side from the position where each open portion occurs. FIG. 15 shows that the bright contrast is exhibited in the area from an open portion 1501 to the end portion 1002 and in the area from an open portion 1502 to the end portion 1003. Then, the dark contrast is exhibited in the area from the open portion 1501 to the just-anterior portion 1503 and in the area from the open portion 1502 to the just-anterior portion 1504.

Figure 16:
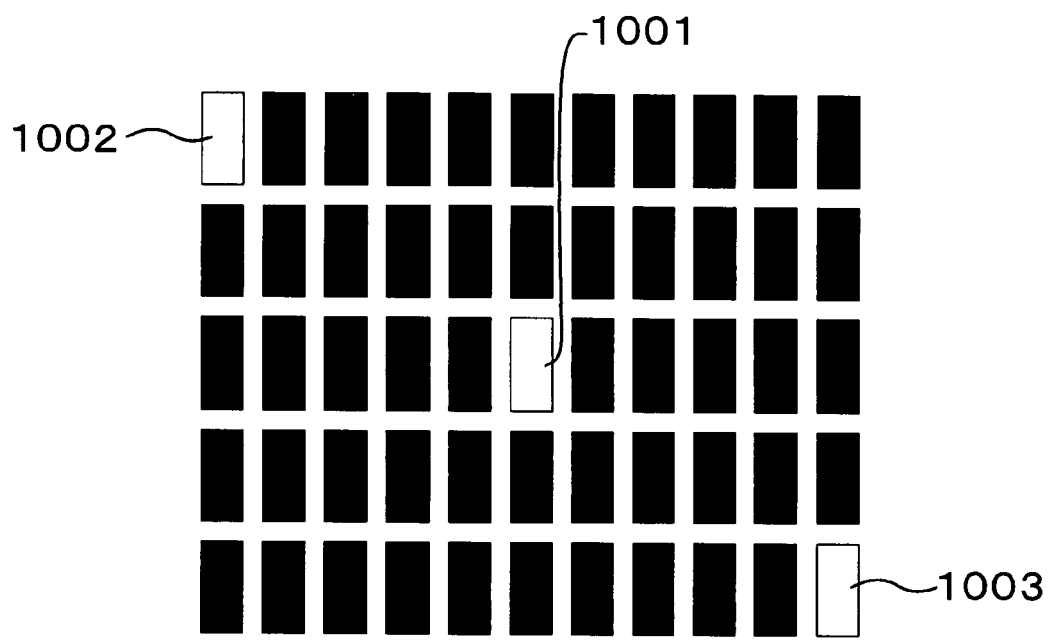
FIG. 16 is a plan view showing a difference between the voltage contrasts in a case where the majority of contact holes get into a failure.

FIG. 16 is a plan view showing a difference between the voltage contrasts in the case where the majority of contact holes get into the failure such as the failure of the contact hole that occurs due to a process having an improper process condition. The inspection pattern is the same as FIG. 10 shows. The metal elements 2 closest to the ground portion are connected by the plurality of contacts. Therefore, the metal elements 2 closest to the ground portion have a high possibility of not becoming the floating state. Then, even in such an extreme case, there occurs the difference in contrast between the metal elements 2 closest to the ground portion and other metal elements 2. Hence, the failure can be detected by the voltage contrast test. FIG. 16 shows that the bright contrast is exhibited at the central portion 1001 of the inspection pattern and the end portions 1002, 1003 of the inspection pattern, while the dark contrast is exhibited in other metal elements 2.

In the embodiment, if the open portion occurs within the inspection pattern, the difference between the contrast can be detected by the voltage contrast test. It is therefore possible to detect whether the open portion occurs within the inspection pattern or not.

The embodiment has exemplified the example where the central portion 1001 of the inspection pattern is grounded, however, the central portion 1001 of the inspection pattern may also be set in the floating state without being grounded. Given hereinafter is an explanation of the difference between the voltage contrasts in the case of floating the central portion 1001 of the inspection pattern.

Figure 17:
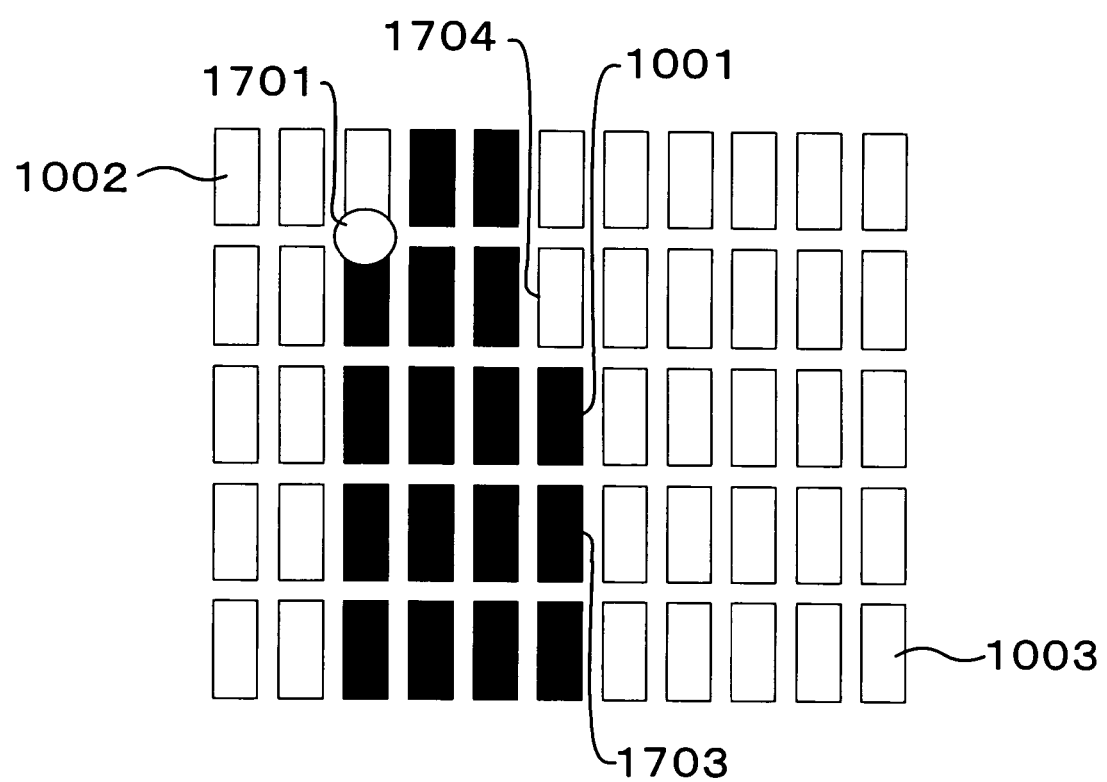
FIG. 17 is a plan view showing a difference between the voltage contrasts in a case where there is one open portion.

FIG. 17 is a plan view showing the difference between the voltage contrasts in the case where there is one open portion. The inspection pattern is such that the metal element 2 of the central portion 1001 of the inspection pattern is separated from just-anterior portions 1703, 1704 and is in the floating state. On the other hand, the contact chains with the end portions 1002, 1003 grounded are disposed on the periphery of the inspection pattern. Other configurations of the inspection pattern are the same as those in FIG. 10. In the case where there is one open portion, the bright contrast is exhibited on the ground side from the position where the open portion occurs, and the dark contrast is exhibited on the floating side from the position where the open portion occurs. FIG. 17 shows that the bright contrast is exhibited in the area from an open portion 1701 to the end portion 1002. Then, the dark contrast is exhibited in the area from the open portion 1701 to the central portion 1001. Furthermore, the bright contrast is exhibited in the area from a just-anterior portion 1704 to the end portion 1003.

Figure 18:
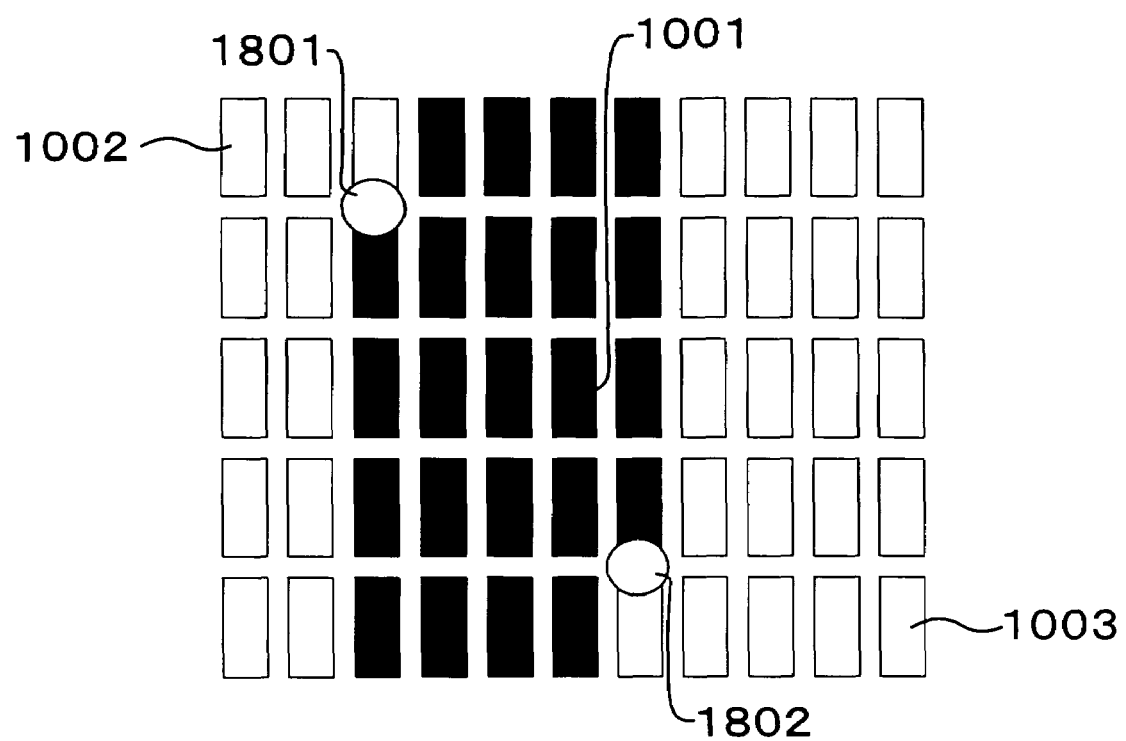
FIG. 18 is a plan view showing a difference between the voltage contrasts in a case where there are two open portions.

FIG. 18 is a plan view showing the difference between the voltage contrasts in the case where there are two open portions. The inspection pattern is such that the metal element 2 of the central portion 1001 of the inspection pattern is set floating, and the contact chains with the end portions 1002, 1003 grounded are disposed on the periphery thereof. Other configurations of the inspection pattern are the same as those in FIG. 10. In the case where there are two open portions, the bright contrast is exhibited on the ground side from the position where each open portion occurs, and the dark contrast is exhibited on the floating side (from one open portion to the other open portion) from the position where each open portion occurs. FIG. 18 shows that the bright contrast is exhibited in the area from an open portion 1801 to the end portion 1002 and in the area from an open portion 1802 to the end portion 1003. Then, the dark contrast is exhibited in the area from the open portion 1801 to the open portion 1802.

Figure 19:
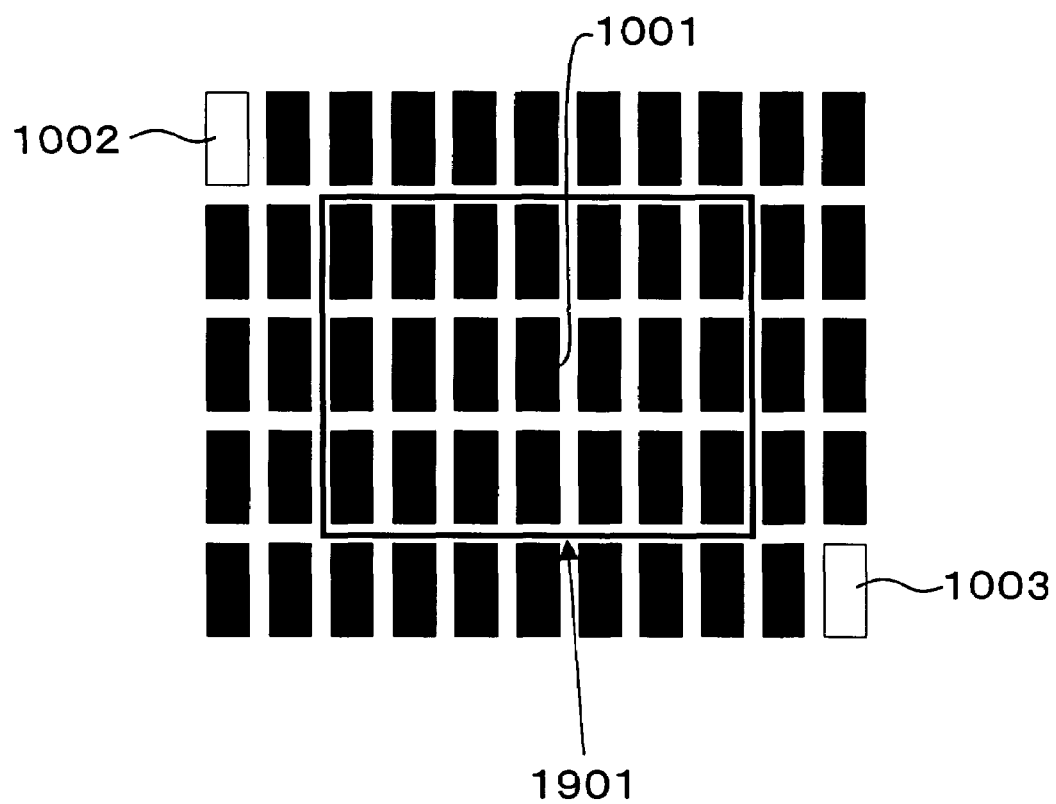
FIG. 19 is a plan view showing a difference between the voltage contrasts in a case where the majority of contact holes get into a failure.

FIG. 19 is a plan view showing a difference between the voltage contrasts in the case where the majority of contact holes get into the failure such as the failure of the contact hole that occurs due to a process having an improper process condition. The inspection pattern is that the metal element 2 of the central portion 1001 of the inspection pattern is set floating, and the contact chains with the end portions 1002, 1003 are disposed on the periphery thereof. Other configurations of the inspection pattern are the same as those in FIG. 10. The metal elements 2 closest to the ground portion have a high possibility of not becoming the floating state. Then, even in such an extreme case, there occurs the difference in contrast between the metal elements 2 closest to the ground portion and other metal elements 2. In the case of performing the voltage contrast test over all the portions of the inspection pattern, as illustrated in FIG. 19, the end portion 1002 and the end portion 1003 of the inspection pattern exhibit the bright contrast. While on the other hand, other metal elements 2 have the dark contrast. A designation area 1901 in FIG. 19 does not include the end portion 1002 and the end portion 1003 of the inspection pattern. Hence, in the case of conducting the voltage contrast test over the designation area 1901, the dark contrast is exhibited in all the metal elements 2 within the designation area 1901. In the case of performing the voltage contrast test for the inspection pattern where none of the open portion occurs, only the central portion 1001 of the inspection pattern has the dark contrast, while other metal elements 2 have the bright contrast. The difference between the contrasts can be detected by comparing such an image contrast that the inspection pattern with none of the open portion occurred is subjected to the voltage contrast test with an image contrast where the inspection pattern with the majority of contact holes getting into the failure is subjected to the voltage contrast test. It is therefore feasible to detect whether the open portion occurs within the inspection pattern or not.

Figure 20:
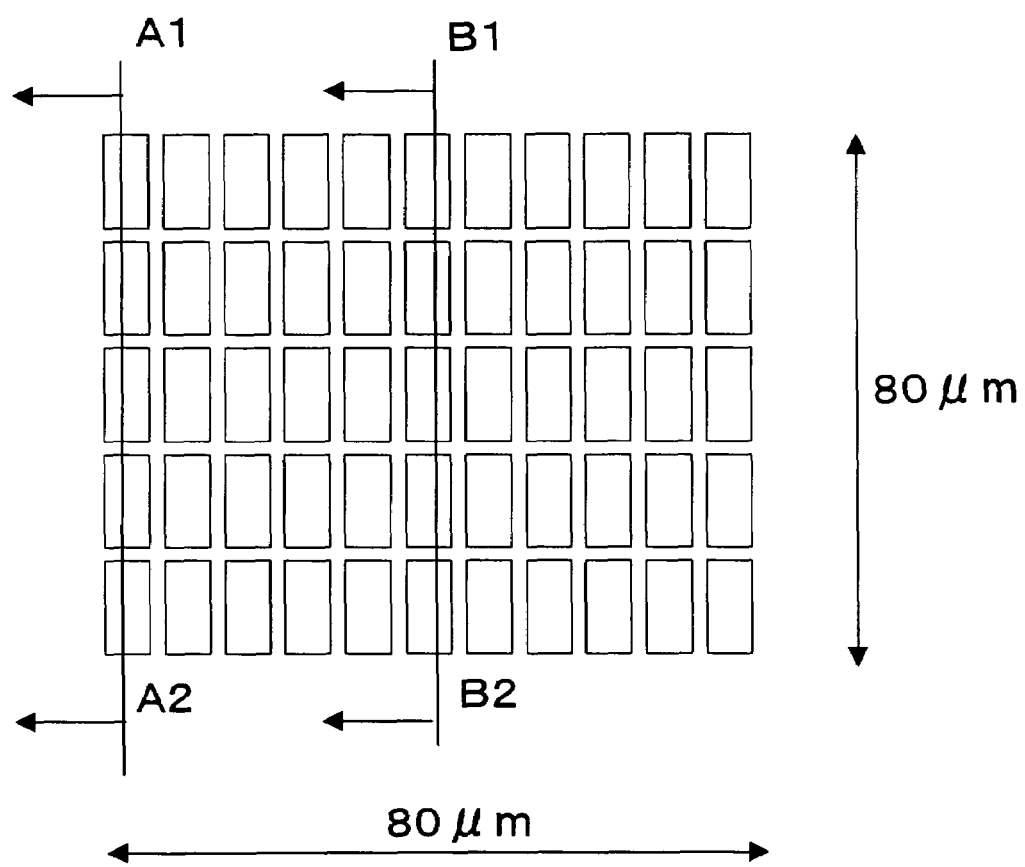
FIG. 20 is a view showing an example of the inspection pattern in the embodiment.
Figure 21:
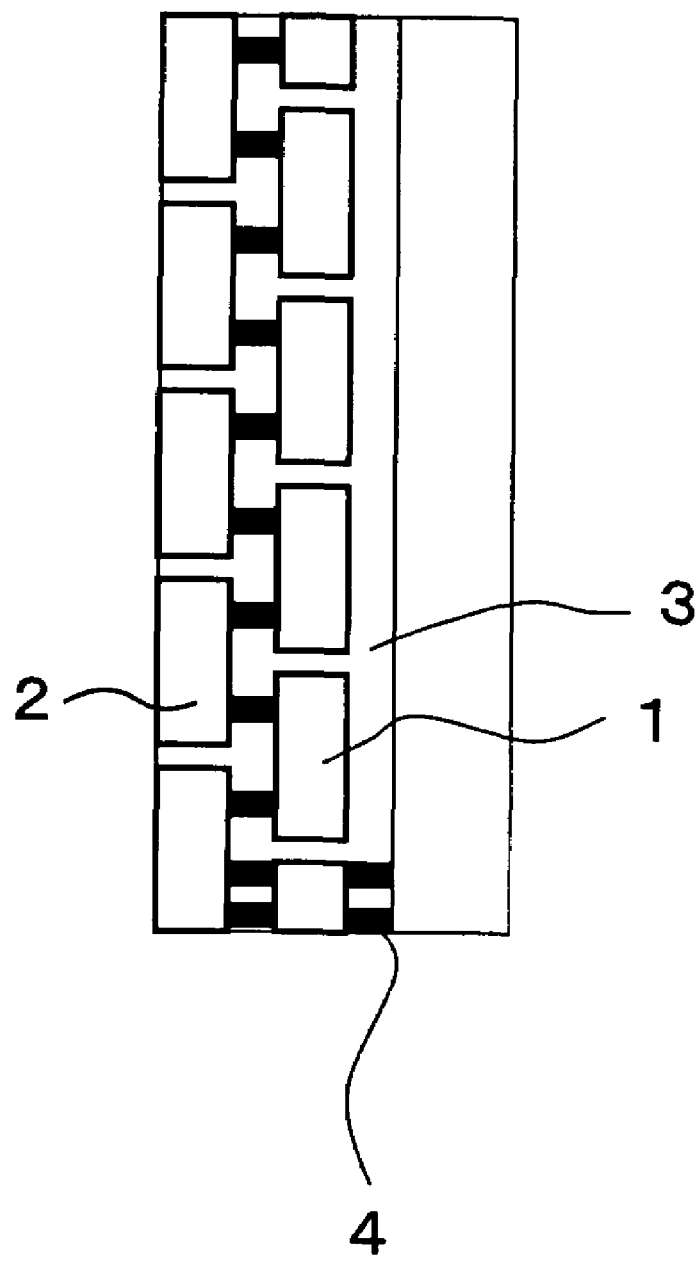
FIG. 21 is a sectional view taken along the line A1-A2 in FIG. 20.
Figure 22:
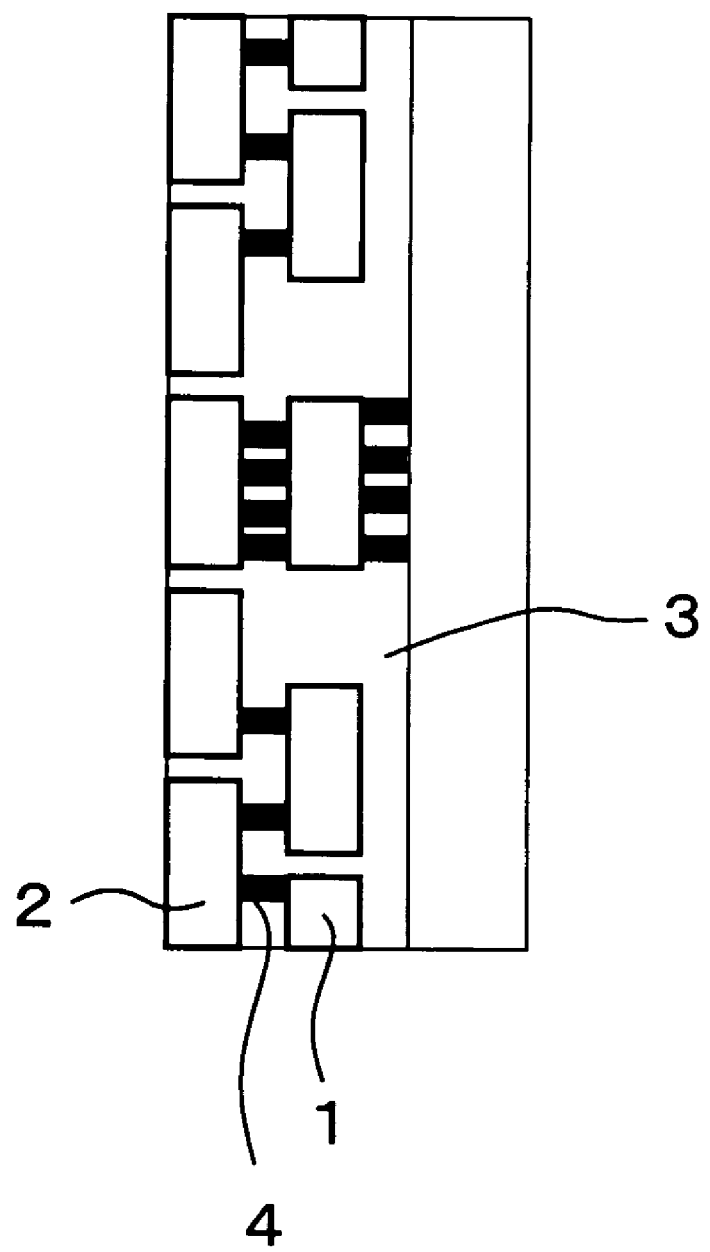
FIG. 22 is a sectional view taken along the line B1-B2 in FIG. 20.

FIG. 20 is a view showing an example of the inspection pattern in the embodiment. FIG. 20 is a plan view showing how the metal elements 2 are arrayed in a rectangle of which one side is 80 μm in the inspection pattern. FIG. 21 is a sectional view taken along the line A1-A2 in FIG. 20. FIG. 22 is a sectional view taken along the line B1-B2 in FIG. 20. Each of the metal element 1 and the metal element 2 is 7 μm in length and 3 μm in width. A lateral interval between the metal elements 2 is set at 3.75 μm, and a vertical interval between the metal elements 2 is set at 7.5 μm, in which case 21 lines of the metal elements 2, as given by 80 μm/3.75 μm=21.3 in the lateral direction, can be arranged within the rectangle of 80 μm. Further, 10 lines of the metal elements 2, as given by 80 μm/7.5 μm=10.7 in the vertical direction, can be arranged. Then, a length of the contact chain of the inspection pattern is given such as 10×21/2×7.5 μm=787.5 μm. Further, a diameter of the contact hole 4 is 0.14 μm, a thickness of the interlayer insulating film 3 is 0.5 μm, and a thickness of the wiring is 0.25 μm. These values are exemplifications, and dimensions of the respective portions (elements) according to the present invention are not limited to these values.

Next, a standard for setting the designation area will be explained. For instance, in the case of conducting the voltage contrast test by use of the inspection device (tester) of which the alignment performance accuracy is on the order of 20 μm, an area, which is 40 μm both in length and in width on the basis of the central portion of the inspection pattern, is set as a voltage contrast designation area. The voltage contrast designation area is thus set, thereby enabling the voltage contrast test to be executed even if the positional deviation of the inspection device occurs. Those values are exemplifications, and the standard of setting the designation area according to the present invention is not limited to those values.

Further, in the embodiment, a wiring width of the metal element 1 and the metal element 2 is set large, and hence the failure due to the disconnection of the metal element 1 and the metal element 2 can be substantially ignored. Accordingly, only the failure in the contact portion can be also detected. The wiring width of the metal element 1 and the metal element 2 can be, however, set to a width that causes the disconnection. In this case, it is possible to detect the failures causing the occurrence of the difference between the contrasts, such as the disconnection and the failure in the contact portion.

Figure 23:
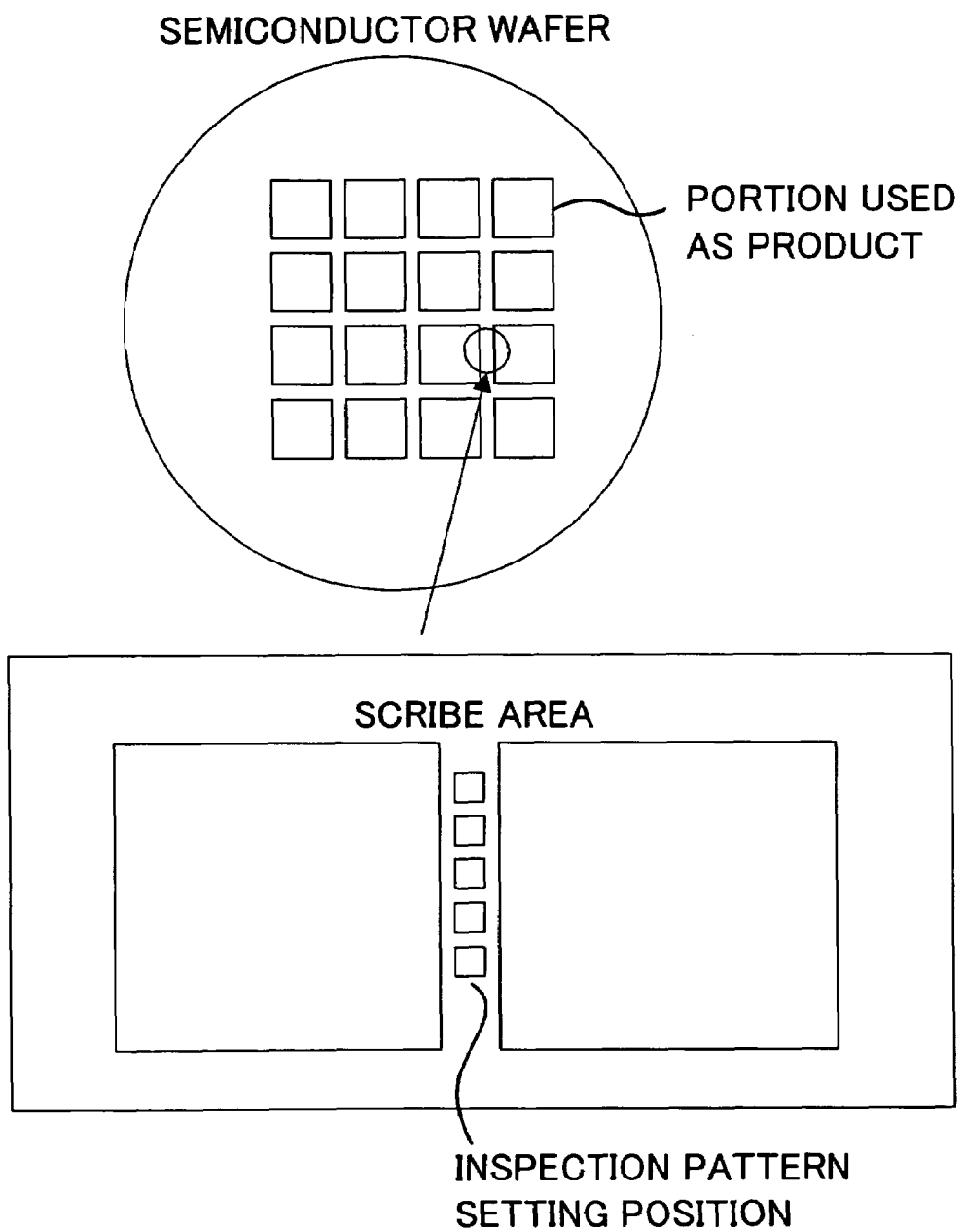
FIG. 23 is a view showing an example of setting the inspection pattern in the embodiment into a scribe area on a semiconductor wafer.

FIG. 23 is a view showing an example in which the inspection pattern in the embodiment is set in a scribe area on a semiconductor wafer. The inspection patterns for the voltage contrast test are arranged in a stacked state on the respective wiring layers, thus enabling the contact chain between the plural wirings can be inspected in the same position. Further, a plurality of intervals between the contact holes of the contact chains within the same layer can be set. Accordingly, it can be individually detected whether or not there occurs the failure of the contact chains including the contact holes having a specified interval. FIG. 23 shows an example where the inspection pattern is set in the scribe area. The inspection pattern can be set also within the area utilized as a product. Namely, the inspection pattern can be also set in a portion that is not utilized for the effective wiring of a dummy pattern etc.

Figure 24:
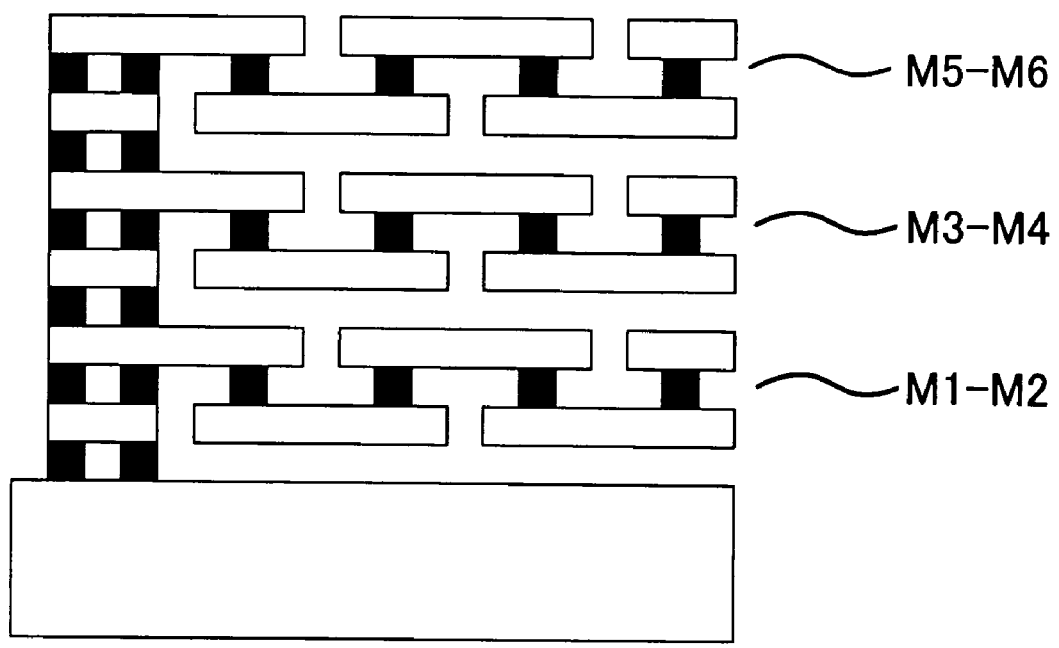
FIG. 24 is a sectional view when stacking the inspection patterns in the embodiment from a first layer through a sixth layer.

FIG. 24 is a sectional view on the occasion of stacking the inspection patterns in the embodiment from a metal wiring layer M1 up to a metal wiring layer M6. To begin with, at a stage of forming the metal wiring layer M1 through the metal wiring layer M2, the voltage contrast test of the contact chains between the layer M1 and the layer M2 is executed. Then, pieces of statistic information such as an intra semiconductor substrate distribution of the voltage contrast defect due to the disconnection and contact hole interval dependency are collected, and feedback to process parameters of the manufacturing process that individually become a cause, is conducted. Further, at the stage of forming the metal wiring layer M3 through the metal wiring layer M4, the voltage contrast test of the contact chains between the layer M3 and the layer M4 is executed. Then, in the same way as between the layers M1 and M2, the statistic information such as the intra semiconductor substrate distribution of the voltage contrast defect due to the disconnection and the contact hole interval dependency is collected, and the feedback to the process parameters of the manufacturing process that individually become the cause, is performed. Moreover, the voltage contrast test of the contact chains on a further upper layer is carried out, and the feedback is implemented.

Thus, a high yield of the whole manufacturing line can be attained by executing the voltage contrast test between the respectively layers and effecting the feedback to manufacturing process. Further, in the embodiment, at the stage of forming the metal wiring layer M2 through the metal wiring layer M3, the voltage contrast test of the contact chains between the layers M2 and M3 can be also carried out. It should be noted that the voltage contrast test of the contact chains is an exemplification but is not limited to the interlayer described above.

In the embodiment, the contact chains configuring the inspection pattern form the conducting paths extending nearly from the vicinity of the outer periphery of the inspection pattern existence area toward the vicinity of the center. Then, in the single contact chain, its end portion (ground point) vicinal to the outer periphery is grounded, and the end portion (floating end portion) vicinal to the center is set floating. Therefore, the single contact chain forms the conducting path grounded only at the vicinity of the outer periphery. If the disconnection failure (open portion) occurs in this type of contact chain, the grounded state occurs in the area from the ground point vicinal to the outer periphery to the open portion. While on the other hand, the floating state occurs in the area from the open portion to the floating end portion vicinal to the center. Hence, even if the designation area irradiated with the electron beams is a partial area in the vicinity of the center within the inspection pattern, the voltage contrast in the designation area changes due to the open portion occurred outside the designation area. As a matter of course, the voltage contrast in the designation area changes also in the case where the open portion occurs within the designation area.

Thus, according to the inspection method in the embodiment, even when the open portion occurs either within or outside the designation area actually irradiated with the electron beams, the occurrence of the open portion is to be detected. Accordingly, if the inspection pattern not actually irradiated with the electron beams is provided outside the designation area, this inspection pattern contributes to the detection of the open portion but does not become futile. Therefore, according to the inspection method in the embodiment, the inspection pattern is effectively utilized, and the efficient inspection pattern can be formed. Further, as a result of no formation of the futile inspection pattern, even when setting the designation area (electron beam irradiating area) smaller than in the related arts in the area of the inspection pattern smaller than in the related arts, the detecting sensitivity of the failure of the contact chain can be maintained.

MODIFIED EXAMPLE

Figure 25:
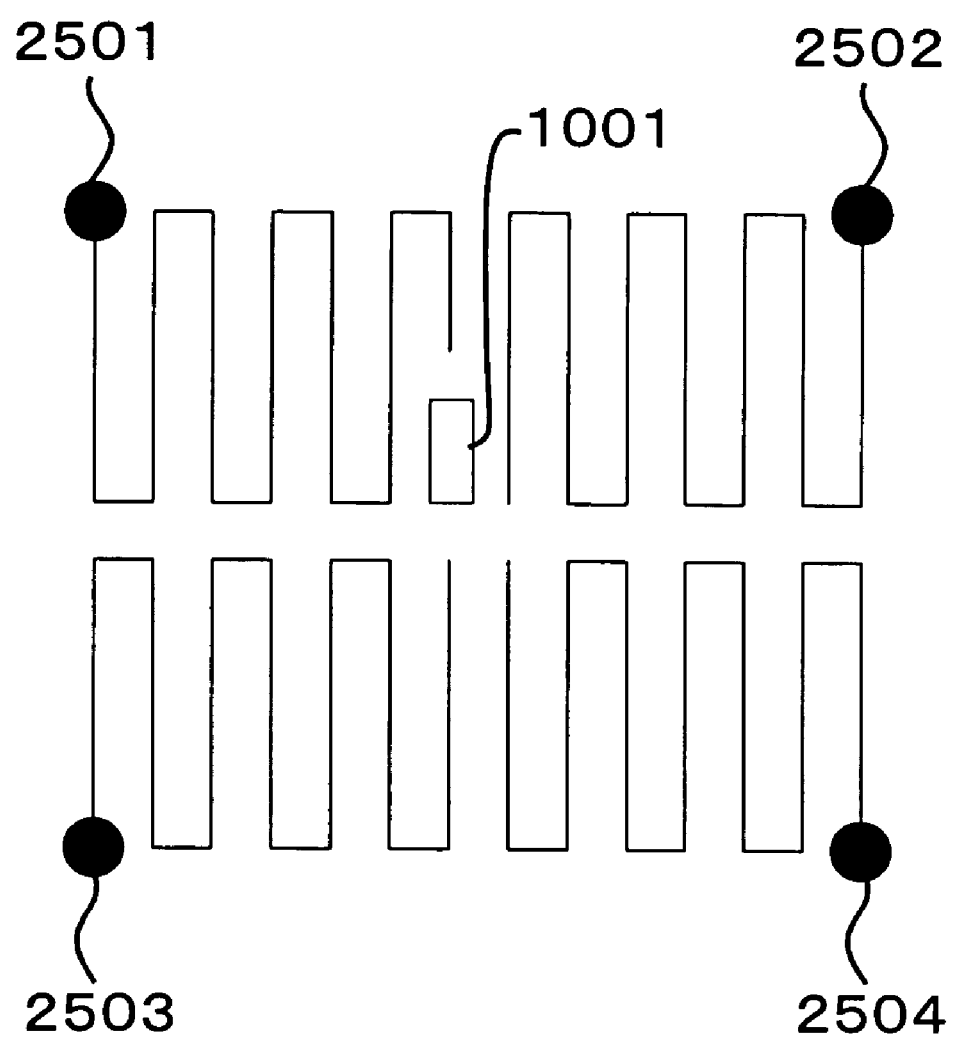
FIG. 25 is a view showing an example of the inspection pattern in the embodiment.

FIG. 25 is a view showing another example of the inspection pattern in the embodiment. In FIG. 25, the metal elements 2 of end portions 2501, 2502, 2503, 2504 of the inspection pattern are grounded. Then, the contact chains are disposed in the downward direction of the metal elements 2 grounded at the upper two positions (the end portions 2501, 2502) of the inspection pattern. Moreover, the contact chains are disposed in the upward direction of the metal elements 2 grounded at the lower two positions (the end portions 2503, 2504) of the inspection pattern. The respective contact chains extend toward the center in the vertical direction (in the up-and-down direction in FIG. 25), and are arranged so as to be folded back at the vicinity of the center. Further, the contact chains, which are arranged so as to be folded back at the vicinity of the center, are disposed in the way of being further folded back toward the center on the outside of the inspection pattern. Thus, the contact chains are repeatedly disposed so that the contact chains are folded back at the vicinity of the inspection pattern and on the outside thereof. As a result, the zigzag conducting paths are formed in the vicinity of the upper and lower portions of the inspection pattern and in the vicinity of the center thereof. As illustrated in FIG. 25, in the four contact chains, the metal elements 2 of the end portions 2501 through 2504 are grounded, and the respective contact chains are not electrically connected to each other. Further, in the same way as in the inspection pattern in FIG. 10, the metal element 2 of the central portion 1001 is not electrically connected to the contact chains. Then, the metal element 2 of the central portion 1001 is grounded or set floating. The structure of the contact chain is the same as the structure explained in FIGS. 11 and 12. To be specific, the metal element 1 and the metal element 2 are alternately disposed, and the electric connection is established by the metal embedded in the contact hole 4 provided in the interlayer insulating film 3 between the metal element 1 and the metal element 2.

Figure 26:
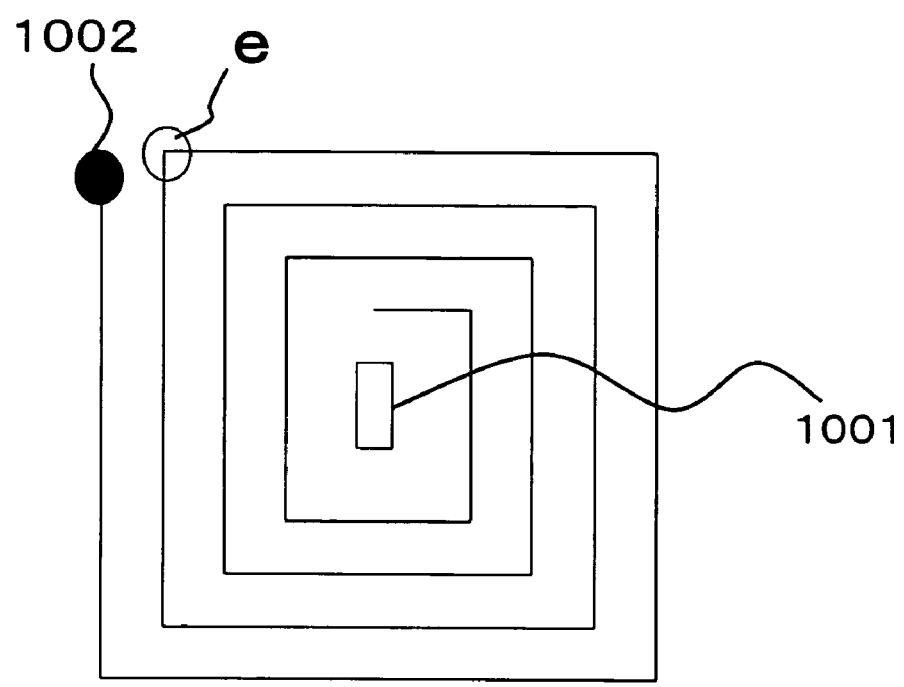
FIG. 26 is a view showing an example of the inspection pattern in the embodiment.
Figure 26:
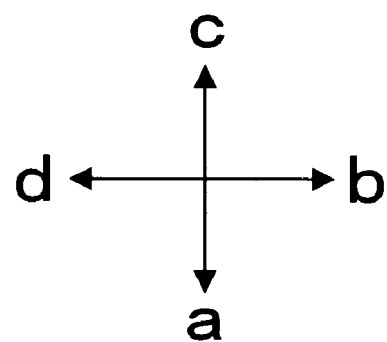

FIG. 26 is a view showing an example of the inspection pattern in the embodiment. In FIG. 26, one of the end portions of the inspection pattern is grounded. In FIG. 26, the metal element 2 of the end portion 1002 is grounded. Then, the contact chain is disposed in a direction a (in a downward direction in FIG. 26) of the metal element 2 grounded at the end portion 1002. The contact chain disposed in the direction a from the end portion 1002 of the inspection pattern is disposed in the way of being perpendicularly folded in a direction b (in a right direction in FIG. 26) in a lower outer area of the inspection pattern. The contact chain, which is disposed so as to be folded perpendicularly in the direction b, is arranged so as to be further folded perpendicularly in a direction c (in an upward direction in FIG. 26) in a left lower outer area of the inspection pattern. The contact chain, which is disposed so as to be folded perpendicularly in the direction c, is arranged so as to be further folded perpendicularly in a direction d (in a left direction in FIG. 26) in a right upper outer area of the inspection pattern. The contact chain, which is disposed so as to be folded perpendicularly in the direction d, is arranged so as to be further folded perpendicularly in the direction a at a portion e just anterior to the end portion 1002 defined as a starting point. Thus, the contact chain is disposed so as to extend nearly in a swirl shape in the central direction. Moreover, in the same way as in the inspection pattern in FIG. 10, the metal element 2 of the central portion 1001 is not electrically connected to the contact chain and is grounded or set floating. The structure of the contact chain is the same as the structure explained in FIGS. 11 and 12. To be specific, the metal element 1 and the metal element 2 are alternately disposed, and the electric connection is established by the metal embedded in the contact hole 4 provided in the interlayer insulating film 3 between the metal element 1 and the metal element 2.

In the embodiment, the plus electric field is applied to the inspection pattern, and the open portion of the contact chain is specified by the voltage contrast test. Further, the brightness and the darkness of the contrast to be detected by the voltage contrast test can be also reversed by applying a minus electric field to the inspection pattern. At first, one end portion of the contact chain disposed in the inspection pattern is grounded at the same potential as that of the semiconductor substrate. Then, the minus electric field is applied to the inspection pattern in order to restrain the emission of the secondary electrons. Next, the surface of the inspection pattern is irradiated with the electron beams. In the area from the floating side to the open portion, the electrons related to the irradiation of the electron beams flood out of the ground side. Hence, there is no change in the potential in the area from the ground side to the open portion. Namely, under such a condition that the minus electric field is applied to the inspection pattern, the emission of the secondary electrons is restrained in the area from the ground side to the open portion. Accordingly, in the area from the ground side to the open portion, the dark contrast is detected by the voltage contrast test. On the other hand, in the area from the floating side to the open portion, a negative charge occurs due to the irradiation of the electron beams. Therefore, in the area from the floating side to the open portion, the potential relatively decreases as compared with the periphery of the inspection pattern. Namely, in the area from the floating side to the open portion, the emission quantity of the secondary electrons increases. Accordingly, under the condition that the minus electric field is applied to the inspection pattern, in the area from the floating side to the open portion, the bright contrast is detected by the voltage contrast test. It is therefore possible to specify the open portion of the contact chain on the basis of the difference between these potential contrasts.

OTHERS

The disclosures of Japanese patent application No. JP2005-280481 filed on Sep. 27, 2005 including the specification, drawings and abstract are incorporated herein by reference.

What is claimed is:

1. A semiconductor device comprising:

a substrate;

a plurality of first conducting elements disposed in a first layer of the substrate;

a plurality of second conducting elements disposed in a second layer of the substrate; and contact holes connecting the first conducting elements and the second conducting elements between the first layer and the second layer, wherein a conducting path built up by combining the plurality of first conducting elements, the plurality of second conducting elements and the contact holes, is formed along a route extending from a peripheral portion to a central portion of an inspection area.

2. A semiconductor device according to claim 1, wherein an end portion positioned at the peripheral portion of the conducting path is electrically connected to the substrate, and portions excluding the end portion are electrically insulated from the substrate.

3. A semiconductor device according to claim 2, wherein at the central portion, the second conducting element electrically disconnected from the conducting path is provided in the second layer in the way of being electrically insulated from the substrate.

4. A semiconductor device according to claim 3, wherein three or more layers of wirings are stacked on the substrate.

5. A semiconductor device according to claim 2, wherein at the central portion, the second conducting element electrically disconnected from the conducting path is provided in the second layer in the way of being electrically connected from the substrate.

6. A semiconductor device according to claim 5, wherein three or more layers of wirings are stacked on the substrate.

7. An inspection structure comprising:

a plurality of first conducting elements disposed in a first layer of the substrate;

a plurality of second conducting elements disposed in a second layer of the substrate; and contact holes connecting the first conducting elements and the second conducting elements between the first layer and the second layer, wherein a conducting path built up by combining the plurality of first conducting elements, the plurality of second conducting elements and the contact holes, is formed along a route extending from a peripheral portion to a central portion of an inspection area.

8. An inspection structure according to claim 7, wherein an end portion positioned at a peripheral portion of the conducting path is electrically connected to the substrate, and portions excluding the end portion are electrically insulated from the substrate.

9. An inspection structure according to claim 8, wherein at the central portion, the second conducting element electrically disconnected from the conducting path is provided in the second layer in the way of being electrically insulated from the substrate, and wherein three or more layers of wirings are stacked on the substrate.

* * * * *